United States Patent
Lynn et al.

(10) Patent No.: US 11,016,607 B2
(45) Date of Patent: *May 25, 2021

(54) CONTROLLING AUDIO VOLUME USING TOUCH INPUT FORCE

(71) Applicant: Sentons Inc., Grand Cayman (KY)

(72) Inventors: Lapoe E. Lynn, Los Altos, CA (US);
Samuel W. Sheng, Saratoga, CA (US);
Shih-Ming Shih, San Jose, CA (US);
Yenyu Hsieh, San Jose, CA (US)

(73) Assignee: Sentons Inc.

( * ) Notice: Subject to any disclaimer, the term of this patent is extended or adjusted under 35 U.S.C. 154(b) by 0 days.

This patent is subject to a terminal disclaimer.

(21) Appl. No.: 16/914,150

(22) Filed: Jun. 26, 2020

(65) Prior Publication Data

US 2020/0326810 A1    Oct. 15, 2020

Related U.S. Application Data

(63) Continuation of application No. 16/426,387, filed on May 30, 2019, now Pat. No. 10,732,755, which is a
(Continued)

(51) Int. Cl.
*H03G 3/02* (2006.01)
*G06F 3/041* (2006.01)
(Continued)

(52) U.S. Cl.
CPC ............ *G06F 3/0418* (2013.01); *G06F 3/041* (2013.01); *G06F 3/043* (2013.01); *G06F 3/0433* (2013.01);
(Continued)

(58) Field of Classification Search
CPC ...... G06F 3/0414; G06F 3/041; G06F 3/0418; G06F 3/043; G06F 3/0433; G06F 3/0436;
(Continued)

(56) References Cited

U.S. PATENT DOCUMENTS

| 3,912,880 A | 10/1975 | Powter |
| 4,488,000 A | 12/1984 | Glenn |

(Continued)

FOREIGN PATENT DOCUMENTS

| CN | 1914585 | 2/2007 |
| CN | 101133385 | 2/2008 |

(Continued)

OTHER PUBLICATIONS

Liu et al., 'Acoustic Wave Approach for Multi-Touch Tactile Sensing', Micro-NanoMechatronics and Human Science, 2009. MHS 2009. International Symposium, Nov. 9-11, 2009.

(Continued)

*Primary Examiner* — Vivian C Chin
*Assistant Examiner* — Con P Tran
(74) *Attorney, Agent, or Firm* — Van Pelt, Yi & James LLP

(57) ABSTRACT

An indicator identifying a force intensity of a touch input provided on a touch input surface is received. It is determined that the touch input is associated with an audio volume control. An audio volume is controlled based at least in part on the indicator identifying the force intensity of the touch input.

20 Claims, 20 Drawing Sheets

Related U.S. Application Data continuation of application No. 16/027,153, filed on Jul. 3, 2018, now Pat. No. 10,353,509, which is a continuation of application No. 15/419,424, filed on Jan. 30, 2017, now Pat. No. 10,055,066, which is a continuation of application No. 13/681,301, filed on Nov. 19, 2012, now Pat. No. 9,594,450.

(60) Provisional application No. 61/561,660, filed on Nov. 18, 2011, provisional application No. 61/561,697, filed on Nov. 18, 2011, provisional application No. 61/673,102, filed on Jul. 18, 2012.

(51) Int. Cl.
*G06F 3/043* (2006.01)
*G06F 3/16* (2006.01)

(52) U.S. Cl.
CPC ............ *G06F 3/0436* (2013.01); *G06F 3/165* (2013.01); *H03G 3/02* (2013.01); *G06F 2203/04106* (2013.01)

(58) Field of Classification Search
CPC . G06F 3/165; G06F 2203/04106; H03G 3/02; H03G 3/001; H03G 3/002
USPC .......... 345/177, 173; 381/109, 107; 715/716
See application file for complete search history.

(56) References Cited

U.S. PATENT DOCUMENTS

| | | |
|---|---|---|
| 4,529,959 A | 7/1985 | Ito |
| 4,594,695 A | 6/1986 | Garconnat |
| 4,966,150 A | 10/1990 | Etienne |
| 5,008,497 A | 4/1991 | Asher |
| 5,074,152 A | 12/1991 | Ellner |
| 5,233,873 A | 8/1993 | Mozgowiec |
| 5,334,805 A | 8/1994 | Knowles |
| 5,451,723 A | 9/1995 | Huang |
| 5,563,849 A | 10/1996 | Hall |
| 5,573,077 A | 11/1996 | Knowles |
| 5,591,945 A | 1/1997 | Kent |
| 5,635,643 A | 6/1997 | Maji |
| 5,637,839 A | 6/1997 | Yamaguchi |
| 5,638,093 A | 6/1997 | Takahashi |
| 5,708,460 A | 1/1998 | Young |
| 5,739,479 A | 4/1998 | Davis-Cannon |
| 5,784,054 A | 7/1998 | Armstrong |
| 5,854,450 A | 12/1998 | Kent |
| 5,883,457 A | 3/1999 | Rinde |
| 5,912,659 A | 6/1999 | Rutledge |
| 6,091,406 A | 7/2000 | Kambara |
| 6,211,772 B1 | 4/2001 | Murakami |
| 6,232,960 B1 | 5/2001 | Goldman |
| 6,236,391 B1 | 5/2001 | Kent |
| 6,254,105 B1 | 7/2001 | Rinde |
| 6,262,946 B1 | 7/2001 | Khuri-Yakub |
| 6,307,942 B1 | 10/2001 | Azima |
| 6,473,075 B1 | 10/2002 | Gomes |
| 6,492,979 B1 | 12/2002 | Kent |
| 6,498,603 B1 | 12/2002 | Wallace |
| 6,535,147 B1 | 3/2003 | Masters |
| 6,567,077 B2 | 5/2003 | Inoue |
| 6,630,929 B1 | 10/2003 | Adler |
| 6,633,280 B1 | 10/2003 | Matsumoto |
| 6,636,201 B1 | 10/2003 | Gomes |
| 6,788,296 B2 | 9/2004 | Ikeda |
| 6,798,403 B2 | 9/2004 | Kitada |
| 6,856,259 B1 | 2/2005 | Sharp |
| 6,891,527 B1 | 5/2005 | Chapman |
| 6,922,642 B2 | 7/2005 | Sullivan |
| 6,948,371 B2 | 9/2005 | Tanaka |
| 7,000,474 B2 | 2/2006 | Kent |
| 7,006,081 B2 | 2/2006 | Kent |
| 7,116,315 B2 | 10/2006 | Sharp |
| 7,119,800 B2 | 10/2006 | Kent |
| 7,187,369 B1 | 3/2007 | Kanbara |
| 7,193,617 B1 | 3/2007 | Kanbara |
| 7,204,148 B2 | 4/2007 | Tanaka |
| 7,218,248 B2 | 5/2007 | Kong |
| 7,274,358 B2 | 9/2007 | Kent |
| RE39,881 E | 10/2007 | Flowers |
| 7,315,336 B2 | 1/2008 | North |
| 7,345,677 B2 | 3/2008 | Ing |
| 7,411,581 B2 | 8/2008 | Hardie-Bick |
| 7,456,825 B2 | 11/2008 | Kent |
| 7,511,711 B2 | 3/2009 | Ing |
| 7,545,365 B2 | 6/2009 | Kent |
| 7,554,246 B2 | 6/2009 | Maruyama |
| 7,583,255 B2 | 9/2009 | Ing |
| 7,649,807 B2 | 1/2010 | Ing |
| 7,683,894 B2 | 3/2010 | Kent |
| 7,880,721 B2 | 2/2011 | Suzuki |
| 7,920,133 B2 | 4/2011 | Tsumura |
| 8,059,107 B2 | 11/2011 | Hill |
| 8,085,124 B2 | 12/2011 | Ing |
| 8,194,051 B2 | 6/2012 | Wu |
| 8,228,121 B2 | 7/2012 | Benhamouda |
| 8,237,676 B2 | 8/2012 | Duheille |
| 8,319,752 B2 | 11/2012 | Hardie-Bick |
| 8,325,159 B2 | 12/2012 | Kent |
| 8,358,277 B2 | 1/2013 | Mosby |
| 8,378,974 B2 | 2/2013 | Aroyan |
| 8,392,486 B2 | 3/2013 | Ing |
| 8,418,083 B1 | 4/2013 | Lundy |
| 8,427,423 B2 | 4/2013 | Tsumura |
| 8,436,806 B2 | 5/2013 | Almalki |
| 8,436,808 B2 | 5/2013 | Chapman |
| 8,493,332 B2 | 7/2013 | D'Souza |
| 8,519,982 B2 | 8/2013 | Camp, Jr. |
| 8,576,202 B2 | 11/2013 | Tanaka |
| 8,619,063 B2 | 12/2013 | Chaine |
| 8,638,318 B2 | 1/2014 | Gao |
| 8,648,815 B2 | 2/2014 | Kent |
| 8,659,579 B2 | 2/2014 | Nadjar |
| 8,670,290 B2 | 3/2014 | Aklil |
| 8,681,128 B2 | 3/2014 | Scharff |
| 8,692,809 B2 | 4/2014 | D'Souza |
| 8,692,810 B2 | 4/2014 | Ing |
| 8,692,812 B2 | 4/2014 | Hecht |
| 8,730,213 B2 | 5/2014 | D'Souza |
| 8,749,517 B2 | 6/2014 | Aklil |
| 8,787,599 B2 | 7/2014 | Grattan |
| 8,791,899 B1 | 7/2014 | Usey |
| 8,823,685 B2 | 9/2014 | Scharff |
| 8,854,339 B2 | 10/2014 | Kent |
| 8,890,852 B2 | 11/2014 | Aroyan |
| 8,896,429 B2 | 11/2014 | Chaine |
| 8,896,564 B2 | 11/2014 | Scharff |
| 8,917,249 B1 | 12/2014 | Buuck |
| 8,941,624 B2 | 1/2015 | Kent |
| 8,946,973 B2 | 2/2015 | Pelletier |
| 8,994,696 B2 | 3/2015 | Berget |
| 9,030,436 B2 | 5/2015 | Ikeda |
| 9,041,662 B2 | 5/2015 | Harris |
| 9,046,959 B2 | 6/2015 | Schevin |
| 9,046,966 B2 | 6/2015 | D'Souza |
| 9,058,071 B2 | 6/2015 | Esteve |
| 9,099,971 B2 | 8/2015 | Lynn |
| 9,189,109 B2 | 11/2015 | Sheng |
| 9,250,742 B1 | 2/2016 | Usey |
| 9,348,468 B2 | 5/2016 | Altekar |
| 9,477,350 B2 | 10/2016 | Sheng |
| 9,594,450 B2 | 3/2017 | Lynn |
| 9,851,848 B2 | 12/2017 | Pellikka |
| 9,983,718 B2 | 5/2018 | Sheng |
| 10,209,825 B2 | 2/2019 | Sheng |
| 10,466,836 B2 | 11/2019 | Sheng |
| 10,795,417 B2 | 10/2020 | Bok |
| 2001/0050677 A1 | 12/2001 | Tosaya |
| 2002/0036621 A1 | 3/2002 | Liu |
| 2002/0047833 A1 | 4/2002 | Kitada |
| 2002/0185981 A1 | 12/2002 | Dietz |

(56) References Cited

U.S. PATENT DOCUMENTS

| | | |
|---|---|---|
| 2003/0161484 A1 | 8/2003 | Kanamori |
| 2003/0164820 A1 | 9/2003 | Kent |
| 2003/0189745 A1 | 10/2003 | Kikuchi |
| 2003/0197691 A1 | 10/2003 | Fujiwara |
| 2003/0206162 A1 | 11/2003 | Roberts |
| 2004/0133366 A1 | 7/2004 | Sullivan |
| 2004/0160421 A1 | 8/2004 | Sullivan |
| 2004/0183788 A1 | 9/2004 | Kurashima |
| 2004/0203594 A1 | 10/2004 | Kotzin |
| 2004/0239649 A1 | 12/2004 | Ludtke |
| 2004/0246239 A1 | 12/2004 | Knowles |
| 2005/0063553 A1 | 3/2005 | Ozawa |
| 2005/0146511 A1 | 7/2005 | Hill |
| 2005/0146512 A1 | 7/2005 | Hill |
| 2005/0174338 A1 | 8/2005 | Ing |
| 2005/0226455 A1 | 10/2005 | Aubauer |
| 2005/0229713 A1 | 10/2005 | Niblock |
| 2005/0248540 A1 | 11/2005 | Newton |
| 2005/0248547 A1 | 11/2005 | Kent |
| 2006/0071912 A1 | 4/2006 | Hill |
| 2006/0109261 A1 | 5/2006 | Chou |
| 2006/0114233 A1 | 6/2006 | Radivojevic |
| 2006/0132315 A1 | 6/2006 | Kurtz |
| 2006/0139339 A1 | 6/2006 | Pechman |
| 2006/0139340 A1 | 6/2006 | Geaghan |
| 2006/0152499 A1 | 7/2006 | Roberts |
| 2006/0166681 A1 | 7/2006 | Lohbihler |
| 2006/0197753 A1 | 9/2006 | Hotelling |
| 2006/0262088 A1 | 11/2006 | Baldo |
| 2006/0262104 A1 | 11/2006 | Sullivan |
| 2006/0279548 A1 | 12/2006 | Geaghan |
| 2006/0284841 A1 | 12/2006 | Hong |
| 2007/0019825 A1 | 1/2007 | Marumoto |
| 2007/0109274 A1 | 5/2007 | Reynolds |
| 2007/0165009 A1 | 7/2007 | Sakurai |
| 2007/0171212 A1 | 7/2007 | Sakurai |
| 2007/0183520 A1 | 8/2007 | Kim |
| 2007/0211022 A1 | 9/2007 | Boillot |
| 2007/0214462 A1 | 9/2007 | Boillot |
| 2007/0229479 A1 | 10/2007 | Choo |
| 2007/0236450 A1 | 10/2007 | Colgate |
| 2007/0240913 A1 | 10/2007 | Schermerhorn |
| 2007/0278896 A1 | 12/2007 | Sarkar |
| 2007/0279398 A1 | 12/2007 | Tsumura |
| 2008/0018618 A1 | 1/2008 | Hill |
| 2008/0030479 A1 | 2/2008 | Lowles |
| 2008/0062151 A1 | 3/2008 | Kent |
| 2008/0081671 A1 | 4/2008 | Wang |
| 2008/0105470 A1 | 5/2008 | Van De Ven |
| 2008/0111788 A1 | 5/2008 | Rosenberg |
| 2008/0169132 A1 | 7/2008 | Ding |
| 2008/0174565 A1 | 7/2008 | Chang |
| 2008/0198145 A1 | 8/2008 | Knowles |
| 2008/0231612 A1 | 9/2008 | Hill |
| 2008/0259030 A1 | 10/2008 | Holtzman |
| 2008/0266266 A1 | 10/2008 | Kent |
| 2008/0284755 A1 | 11/2008 | Hardie-Bick |
| 2009/0009488 A1 | 1/2009 | D'Souza |
| 2009/0103853 A1 | 4/2009 | Daniel |
| 2009/0116661 A1 | 5/2009 | Hetherington |
| 2009/0146533 A1 | 6/2009 | Leskinen |
| 2009/0160728 A1 | 6/2009 | Emrick |
| 2009/0167704 A1 | 7/2009 | Terlizzi |
| 2009/0237372 A1 | 9/2009 | Kim |
| 2009/0271004 A1 | 10/2009 | Zecchin |
| 2009/0273583 A1 | 11/2009 | Norhammar |
| 2009/0309853 A1 | 12/2009 | Hildebrandt |
| 2009/0315848 A1 | 12/2009 | Ku |
| 2010/0026667 A1 | 2/2010 | Bernstein |
| 2010/0027810 A1 | 2/2010 | Marton |
| 2010/0044121 A1 | 2/2010 | Simon |
| 2010/0045635 A1 | 2/2010 | Soo |
| 2010/0079264 A1 | 4/2010 | Hoellwarth |
| 2010/0117933 A1 | 5/2010 | Gothard |
| 2010/0117993 A1 | 5/2010 | Kent |
| 2010/0123686 A1 | 5/2010 | Klinghult |
| 2010/0141408 A1 | 6/2010 | Doy |
| 2010/0156818 A1 | 6/2010 | Burrough |
| 2010/0165215 A1 | 7/2010 | Shim |
| 2010/0185989 A1 | 7/2010 | Shiplacoff |
| 2010/0188356 A1 | 7/2010 | Vu |
| 2010/0245265 A1 | 9/2010 | Sato |
| 2010/0269040 A1 | 10/2010 | Lee |
| 2010/0277431 A1 | 11/2010 | Klinghult |
| 2010/0283759 A1 | 11/2010 | Iso |
| 2010/0309139 A1 | 12/2010 | Ng |
| 2010/0311337 A1 | 12/2010 | Riviere |
| 2010/0315373 A1 | 12/2010 | Steinhauser |
| 2010/0321312 A1 | 12/2010 | Han |
| 2010/0321325 A1 | 12/2010 | Springer |
| 2010/0321337 A1 | 12/2010 | Liao |
| 2011/0001707 A1 | 1/2011 | Faubert |
| 2011/0001708 A1 | 1/2011 | Sleeman |
| 2011/0012717 A1 | 1/2011 | Pance |
| 2011/0013785 A1 | 1/2011 | Kim |
| 2011/0018695 A1 | 1/2011 | Bells |
| 2011/0025649 A1 | 2/2011 | Sheikhzadeh Nadjar |
| 2011/0042152 A1 | 2/2011 | Wu |
| 2011/0057903 A1 | 3/2011 | Yamano |
| 2011/0063228 A1 | 3/2011 | St Pierre |
| 2011/0080350 A1 | 4/2011 | Almalki |
| 2011/0084912 A1 | 4/2011 | Almalki |
| 2011/0084937 A1 | 4/2011 | Chang |
| 2011/0141052 A1 | 6/2011 | Bernstein |
| 2011/0155479 A1 | 6/2011 | Oda |
| 2011/0156967 A1 | 6/2011 | Oh |
| 2011/0167391 A1 | 7/2011 | Momeyer |
| 2011/0175813 A1 | 7/2011 | Sarwar |
| 2011/0182443 A1 | 7/2011 | Gant |
| 2011/0191680 A1 | 8/2011 | Chae |
| 2011/0199342 A1 | 8/2011 | Vartanian |
| 2011/0213223 A1 | 9/2011 | Kruglick |
| 2011/0222372 A1 | 9/2011 | O'Donovan |
| 2011/0225549 A1 | 9/2011 | Kim |
| 2011/0234545 A1 | 9/2011 | Tanaka |
| 2011/0248978 A1 | 10/2011 | Koyama |
| 2011/0260988 A1 | 10/2011 | Colgate |
| 2011/0260990 A1 | 10/2011 | Ali |
| 2011/0279382 A1 | 11/2011 | Pertuit |
| 2011/0298670 A1 | 12/2011 | Jung |
| 2011/0300845 A1 | 12/2011 | Lee |
| 2011/0304577 A1 | 12/2011 | Brown |
| 2011/0316784 A1 | 12/2011 | Bisutti |
| 2011/0316790 A1 | 12/2011 | Ollila |
| 2012/0001875 A1 | 1/2012 | Li |
| 2012/0002820 A1 | 1/2012 | Leichter |
| 2012/0007837 A1 | 1/2012 | Kent |
| 2012/0026114 A1 | 2/2012 | Lee |
| 2012/0030628 A1 | 2/2012 | Lee |
| 2012/0032928 A1 | 2/2012 | Alberth |
| 2012/0050230 A1 | 3/2012 | Harris |
| 2012/0062564 A1 | 3/2012 | Miyashita |
| 2012/0068939 A1 | 3/2012 | Pemberton-Pigott |
| 2012/0068970 A1 | 3/2012 | Pemberton-Pigott |
| 2012/0081337 A1 | 4/2012 | Camp, Jr. |
| 2012/0088548 A1 | 4/2012 | Yun |
| 2012/0092964 A1 | 4/2012 | Badiey |
| 2012/0104901 A1 | 5/2012 | Jiang |
| 2012/0120031 A1 | 5/2012 | Thuillier |
| 2012/0126962 A1 | 5/2012 | Ujii |
| 2012/0127088 A1 | 5/2012 | Pance |
| 2012/0140954 A1 | 6/2012 | Ranta |
| 2012/0144293 A1 | 6/2012 | Kim |
| 2012/0149437 A1 | 6/2012 | Zurek |
| 2012/0188194 A1 | 7/2012 | Sulem |
| 2012/0188889 A1 | 7/2012 | Sambhwani |
| 2012/0194466 A1 | 8/2012 | Posamentier |
| 2012/0200517 A1 | 8/2012 | Nikolovski |
| 2012/0206154 A1 | 8/2012 | Pant |
| 2012/0229407 A1 | 9/2012 | Harris |
| 2012/0232834 A1 | 9/2012 | Roche |
| 2012/0235866 A1 | 9/2012 | Kim |
| 2012/0242603 A1 | 9/2012 | Engelhardt |
| 2012/0270605 A1 | 10/2012 | Garrone |

(56) References Cited

U.S. PATENT DOCUMENTS

| | | |
|---|---|---|
| 2012/0272089 A1 | 10/2012 | Hatfield |
| 2012/0278490 A1 | 11/2012 | Sennett |
| 2012/0280944 A1 | 11/2012 | St Pierre |
| 2012/0282944 A1 | 11/2012 | Zhao |
| 2012/0300956 A1 | 11/2012 | Horii |
| 2012/0306823 A1 | 12/2012 | Pance |
| 2013/0011144 A1 | 1/2013 | Amiri Farahani |
| 2013/0050133 A1 | 2/2013 | Brakensiek |
| 2013/0050154 A1 | 2/2013 | Guy |
| 2013/0057491 A1 | 3/2013 | Chu |
| 2013/0059532 A1 | 3/2013 | Mahanfar |
| 2013/0082970 A1 | 4/2013 | Frey |
| 2013/0127755 A1 | 5/2013 | Lynn |
| 2013/0141364 A1 | 6/2013 | Lynn |
| 2013/0141365 A1 | 6/2013 | Lynn |
| 2013/0147768 A1 | 6/2013 | Aroyan |
| 2013/0194208 A1 | 8/2013 | Miyanaka |
| 2013/0222274 A1 | 8/2013 | Mori |
| 2013/0234995 A1 | 9/2013 | Son |
| 2013/0249831 A1 | 9/2013 | Harris |
| 2014/0028576 A1 | 1/2014 | Shahparnia |
| 2014/0078070 A1 | 3/2014 | Armstrong-Muntner |
| 2014/0078086 A1 | 3/2014 | Bledsoe |
| 2014/0078109 A1 | 3/2014 | Armstrong-Muntner |
| 2014/0078112 A1 | 3/2014 | Sheng |
| 2014/0185834 A1 | 7/2014 | Frömel |
| 2014/0247230 A1 | 9/2014 | Sheng |
| 2014/0247250 A1 | 9/2014 | Sheng |
| 2014/0317722 A1 | 10/2014 | Tartz |
| 2014/0362055 A1 | 12/2014 | Altekar |
| 2014/0368464 A1 | 12/2014 | Singnurkar |
| 2015/0002415 A1 | 1/2015 | Lee |
| 2015/0002452 A1 | 1/2015 | Klinghult |
| 2015/0009185 A1 | 1/2015 | Shi |
| 2015/0109239 A1 | 4/2015 | Mao |
| 2015/0199035 A1 | 7/2015 | Chang |
| 2015/0253895 A1 | 9/2015 | Kim |
| 2015/0346850 A1 | 12/2015 | Vandermeijden |
| 2015/0366504 A1 | 12/2015 | Connor |
| 2016/0048266 A1 | 2/2016 | Smith |
| 2016/0062517 A1 | 3/2016 | Meyer |
| 2016/0070404 A1 | 3/2016 | Kerr |
| 2016/0091308 A1 | 3/2016 | Oliaei |
| 2016/0139717 A1 | 5/2016 | Filiz |
| 2016/0162044 A1 | 6/2016 | Ciou |
| 2016/0179249 A1 | 6/2016 | Ballan |
| 2016/0209944 A1 | 7/2016 | Shim |
| 2016/0282312 A1 | 9/2016 | Cable |
| 2016/0282965 A1 | 9/2016 | Jensen |
| 2016/0349922 A1 | 12/2016 | Choi |
| 2017/0010697 A1 | 1/2017 | Jiang |
| 2017/0020402 A1 | 1/2017 | Rogers |
| 2017/0024055 A1 | 1/2017 | Schwarz |
| 2017/0083164 A1 | 3/2017 | Sheng |
| 2018/0032211 A1 | 2/2018 | King |
| 2018/0067612 A1 | 3/2018 | Smith |
| 2018/0129333 A1 | 5/2018 | Zheng |
| 2018/0136770 A1 | 5/2018 | Kwong |
| 2018/0143669 A1 | 5/2018 | Bok |
| 2018/0348014 A1 | 12/2018 | Astley |
| 2019/0212846 A1 | 7/2019 | Nathan |
| 2019/0383676 A1 | 12/2019 | Foughi |

FOREIGN PATENT DOCUMENTS

| | | |
|---|---|---|
| CN | 101373415 | 2/2009 |
| CN | 101568898 | 10/2009 |
| CN | 101669088 | 3/2010 |
| CN | 101978344 | 2/2011 |
| CN | 103890701 | 6/2014 |
| CN | 104169848 | 11/2014 |
| CN | 103677339 | 7/2017 |
| EP | 2315101 | 4/2011 |
| EP | 2315101 | 1/2014 |
| FR | 2948787 | 2/2011 |
| JP | 07160355 | 6/1995 |
| JP | 2005092527 | 4/2005 |
| JP | 5723499 | 5/2015 |
| KR | 20040017272 | 2/2004 |
| KR | 20070005580 | 1/2007 |
| KR | 20080005990 | 1/2008 |
| KR | 20110001839 | 1/2011 |
| WO | 03005292 | 1/2003 |
| WO | 2006131022 | 12/2006 |
| WO | 2006115947 | 6/2007 |
| WO | 2009028680 | 3/2009 |
| WO | 2011010037 | 1/2011 |
| WO | 2011024434 | 3/2011 |
| WO | 2011048433 | 4/2011 |
| WO | 2011051722 | 5/2011 |
| WO | 2012010912 | 1/2012 |
| WO | 2014066621 | 6/2014 |
| WO | 2014209757 | 12/2014 |
| WO | 2015027017 | 2/2015 |
| WO | 2015127167 | 8/2015 |

OTHER PUBLICATIONS

T Benedict et al. 'The joint estimation of signal and noise from the sum envelope' IEEE Transactions on Information Theory 13.3, pp. 447-454. Jul. 1, 1967.

2000

Light Force Increments Slider Bar at 1% per 1mm of Finger Movement

Higher Force Increments Slider Bar at 10% per 1mm of Finger Movement

CONTROLLING AUDIO VOLUME USING TOUCH INPUT FORCE

CROSS REFERENCE TO OTHER APPLICATIONS

This application is a continuation of co-pending U.S. patent application Ser. No. 16/426,387, entitled CONTROLLING AUDIO VOLUME USING TOUCH INPUT FORCE filed May 30, 2019 which is incorporated herein by reference for all purposes, which is a continuation of U.S. patent application Ser. No. 16/027,153, entitled CONTROLLING AUDIO VOLUME USING TOUCH INPUT FORCE filed Jul. 3, 2018, now U.S. Pat. No. 10,353,509, which is incorporated herein by reference for all purposes, which is a continuation of U.S. patent application Ser. No. 15/419,424, entitled CONTROLLING AUDIO VOLUME USING TOUCH INPUT FORCE filed Jan. 30, 2017, now U.S. Pat. No. 10,055,066, which is incorporated herein by reference for all purposes, which is a continuation of U.S. patent application Ser. No. 13/681,301, entitled CONTROLLING AUDIO VOLUME USING TOUCH INPUT FORCE filed Nov. 19, 2012, now U.S. Pat. No. 9,594,450, which is incorporated herein by reference for all purposes.

U.S. patent application Ser. No. 13/681,301 claims priority to U.S. Provisional Application No. 61/561,660, entitled TOUCH SCREEN SYSTEM UTILIZING ADDITIONAL AXIS INFORMATION FOR SELECTED APPLICATIONS filed Nov. 18, 2011 which is incorporated herein by reference for all purposes.

U.S. patent application Ser. No. 13/681,301 claims priority to U.S. Provisional Application No. 61/561,697, entitled TOUCH SCREEN SYSTEM UTILIZING ADDITIONAL AXIS INFORMATION filed Nov. 18, 2011 which is incorporated herein by reference for all purposes.

U.S. patent application Ser. No. 13/681,301 claims priority to U.S. Provisional Application No. 61/673,102, entitled UTILIZING TOUCH PRESSURE INFORMATION IN GRAPHICAL USER INTERFACES filed Jul. 18, 2012 which is incorporated herein by reference for all purposes.

BACKGROUND OF THE INVENTION

Various technologies have been used to detect a touch input on a display area. The most popular technologies today include capacitive and resistive touch detection technology. Using resistive touch technology, often a glass panel is coated with multiple conductive layers that register touches when physical pressure is applied to the layers to force the layers to make physical contact. Using capacitive touch technology, often a glass panel is coated with material that can hold an electrical charge sensitive to a human finger. By detecting the change in the electrical charge due to a touch, a touch location can be detected. However, with resistive and capacitive touch detection technologies, the glass screen is required to be coated with a material that reduces the clarity of the glass screen. Additionally, because the entire glass screen is required to be coated with a material, manufacturing and component costs can become prohibitively expensive as larger screens are desired.

Another type of touch detection technology includes surface acoustic wave technology. One example includes the Elo Touch Systems Acoustic Pulse Recognition, commonly called APR, manufactured by Elo Touch Systems of 301 Constitution Drive, Menlo Park, Calif. 94025. The APR system includes transducers attached to the edges of a touchscreen glass that pick up the sound emitted on the glass due to a touch. However, the surface glass may pick up other external sounds and vibrations that reduce the accuracy and effectiveness of the APR system to efficiently detect a touch input. Another example includes the Surface Acoustic Wave-based technology, commonly called SAW, such as the Elo IntelliTouch Plus™ of Elo Touch Systems. The SAW technology sends ultrasonic waves in a guided pattern using reflectors on the touch screen to detect a touch. However, sending the ultrasonic waves in the guided pattern increases costs and may be difficult to achieve. Detecting additional types of inputs, such as multi-touch inputs, may not be possible or may be difficult using SAW or APR technology.

Additionally, current touch detection technology cannot reliably, accurately, and efficiently detect pressure or force of a touch input. Although prior attempts have been made to detect pressure of touch input by measuring the relative size of a touch input (e.g., as a finger presses harder on a screen, area of the finger contacting the screen proportionally increases), these attempts produce unreliable results when a hard stylus or different sized fingers are used. Therefore there exists a need for a better way to detect an input on a surface. Once force or pressure of a touch input can be reliably detected, user interface interaction utilizing force or pressure may be provided.

BRIEF DESCRIPTION OF THE DRAWINGS

Various embodiments of the invention are disclosed in the following detailed description and the accompanying drawings.

DETAILED DESCRIPTION

Figure 1:
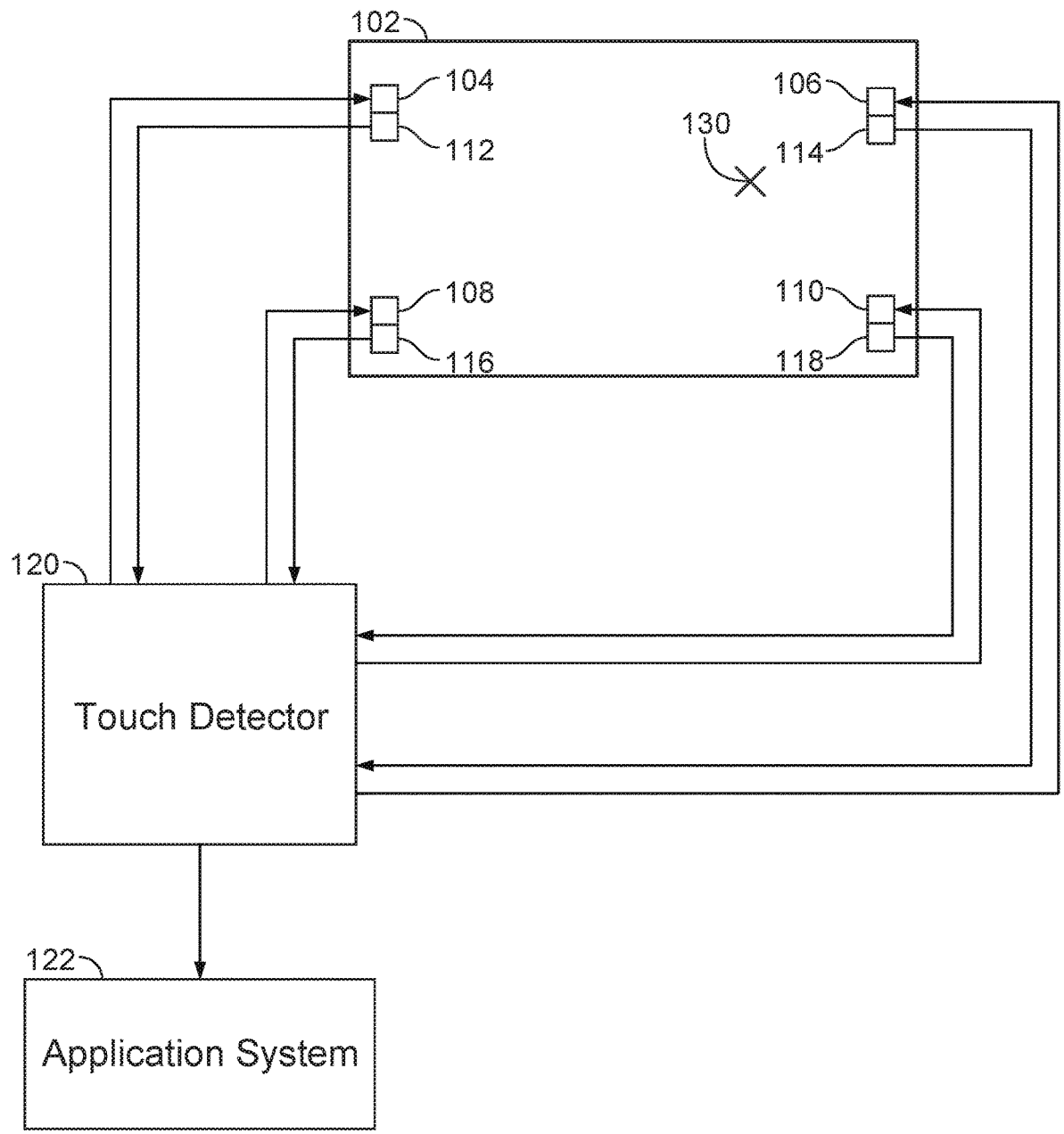
FIG. 1 is a block diagram illustrating an embodiment of a system for detecting a surface disturbance.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Detecting a force of a touch input is disclosed. In some embodiments, an acoustic transducer transmits an acoustic wave through a medium of a touch input surface. The acoustic wave may be scattered by the touch input producing a scattered acoustic wave. An acoustic detector that detects the scattered acoustic wave and the acoustic detector outputs a signal indicating variation of the acoustic wave that is indicative of an amount of force associated with the touch input. In some embodiments, the force of a touch input is associated with the amount of deflection or movement of a touch surface medium caused by a touch input. For example, as a finger or stylus touches and pushes a touch input surface harder, the amount of force detected gets functionally larger as well. The pressure of a touch input is the force of touch input per unit area of the touch input. For example, the total force of a touch input divided by the area of contact of the touch input equals the pressure of the touch input. Although force of a touch input is utilized in the specification, pressure of a touch input may be used as well. In some cases, when a user pushes harder on a surface such as a touch screen display with a fingertip, the pressure of the touch input may stay substantially constant because the size of the fingertip in contact with the surface becomes larger due to the softness of the fingertip. In order to detect that the user is pushing harder on the surface, the total force of the touch input may be used instead of the pressure of the touch input. In some embodiments, a force of a touch input is used to provide user interface interaction.

In some embodiments, a user touch input on the glass surface of a display screen is detected. In some embodiments, a signal such as an acoustic or ultrasonic signal is propagated freely through a propagating medium with a surface using a transmitter coupled to the medium. When the surface is touched, the propagated signal is disturbed (e.g., the touch causes an interference with the propagated signal). In some embodiments, the disturbed signal is received at a sensor coupled to the propagating medium. By processing the received signal and comparing it against an expected signal without the disturbance, a location on the surface associated with the touch input is at least in part determined. For example, the disturbed signal is received at a plurality of sensors and a relative time difference between when the disturbed signal was received at different sensors is used to determine the location on the surface. In various embodiments, the touch includes a physical contact to a surface using a human finger, pen, pointer, stylus, and/or any other body parts or objects that can be used to contact or disturb the surface. In some embodiments, the touch includes an input gesture and/or a multi-touch input.

In some embodiments, the disturbed signal is used to determine one or more of the following associated with a touch input: a gesture, a coordinate position, a time, a time frame, a direction, a velocity, a force magnitude, a proximity magnitude, a pressure, a size, and other measurable or derived parameters. In some embodiments, by detecting disturbances of a freely propagated signal, touch input detection technology can be applied to larger surface regions with less or no additional cost due to a larger surface region as compared to certain previous touch detection technologies. Additionally, the optical transparency of a touch screen may not have to be affected as compared to resistive and capacitive touch technologies. Merely by way of example, the touch detection described herein can be applied to a variety of objects such as a kiosk, an ATM, a computing device, an entertainment device, a digital signage apparatus, a cell phone, a tablet computer, a point of sale terminal, a food and restaurant apparatus, a gaming device, a casino game and application, a piece of furniture, a vehicle, an industrial application, a financial application, a medical device, an appliance, and any other objects or devices having surfaces.

FIG. 1 is a block diagram illustrating an embodiment of a system for detecting a surface disturbance. In some embodiments, the system shown in FIG. 1 is included in a kiosk, an ATM, a computing device, an entertainment device, a digital signage apparatus, a cell phone, a tablet computer, a point of sale terminal, a food and restaurant apparatus, a gaming device, a casino game and application, a piece of furniture, a vehicle, an industrial application, a financial application, a medical device, an appliance, and any other objects or devices having surfaces. Propagating signal medium 102 is coupled to transmitters 104, 106, 108, and 110 and sensors 112, 114, 116, and 118. In various embodiments, the propagating medium includes one or more of the following: panel, table, glass, screen, door, floor, whiteboard, glass, plastic, wood, steel, metal, semiconductor, insulator, conductor, and any medium that is able to propagate an acoustic or ultrasonic signal. For example, medium 102 is glass of a display screen. A first surface of medium 102 includes a surface area where a user may touch to provide a selection input and a substantially opposite surface of medium 102 is coupled to the transmitters and sensors shown in FIG. 1. In various embodiments, a surface of medium 102 is substantially flat, curved, or combinations thereof and may be configured in a variety of shapes such as rectangular, square, oval, circular, trapezoidal, annular, or any combination of these, and the like.

Examples of transmitters 104, 106, 108, and 110 include piezoelectric transducers, electromagnetic transducers, transmitters, sensors and/or any other transmitters and transducers capable of propagating a signal through medium 102. Examples of sensors 112, 114, 116, and 118 include piezoelectric transducers, electromagnetic transducers, transmitters and/or any other sensors and transducers capable of detecting a signal on medium 102. In some embodiments, the transmitters and sensors shown in FIG. 1 are coupled to medium 102 in a manner that allows a user input to be detected in a predetermined region of medium 102. Although four transmitters and four sensors are shown, any number of transmitters and any number of sensors may be used in other embodiments. For example, two transmitters and three sensors may be used. In some embodiments, a single transducer acts as both a transmitter and a sensor. For example, transmitter 104 and sensor 112 represent a single piezoelectric transducer. In the example shown, transmitter 104 may propagate a signal through medium 102. Sensors 112, 114, 116, and 118 receive the propagated signal. In another embodiment, the transmitters/sensors in FIG. 1 are attached to a flexible cable coupled to medium 102 via an encapsulant and/or glue material and/or fasteners.

Touch detector 120 is connected to the transmitters and sensors shown in FIG. 1. In some embodiments, detector 120 includes one or more of the following: an integrated circuit chip, a printed circuit board, a processor, and other electrical components and connectors. Detector 120 determines and sends a signal to be propagated by transmitters 104, 106, 108, and 110. Detector 120 also receives the signal detected by sensors 112, 114, 116, and 118. The received signals are processed by detector 120 to determine whether a disturbance associated with a user input has been detected at a location on a surface of medium 102 associated with the disturbance. Detector 120 is in communication with application system 122. Application system 122 uses information provided by detector 120. For example, application system 122 receives from detector 120 a coordinate associated with a user touch input that is used by application system 122 to control a software application of application system 122. In some embodiments, application system 122 includes a processor and/or memory/storage. In other embodiments, detector 120 and application system 122 are at least in part included/processed in a single processor. An example of data provided by detector 120 to application system 122 includes one or more of the following associated with a user indication: a location coordinate of a surface of medium 102, a gesture, simultaneous user indications (e.g., multi-touch input), a time, a status, a direction, a velocity, a force magnitude, a proximity magnitude, a pressure, a size, and other measurable or derived information.

In some embodiments, a touch input is received at location 130 on a surface of medium 102. For example, a user touches the surface of medium 102 at location 130. In some embodiments, one or more of transmitters 104, 106, 108, and 110 transmit one or more active signals that are propagated through medium 102. The touch input at location 130 disturbs (e.g., scatters) the propagated signal(s) and the disturbed signals are received at sensors 112, 114, 116, and 118. By measuring the disturbance(s) of the propagated signal(s), the location and/or a force associated with the touch input may be determined.

Figure 2:
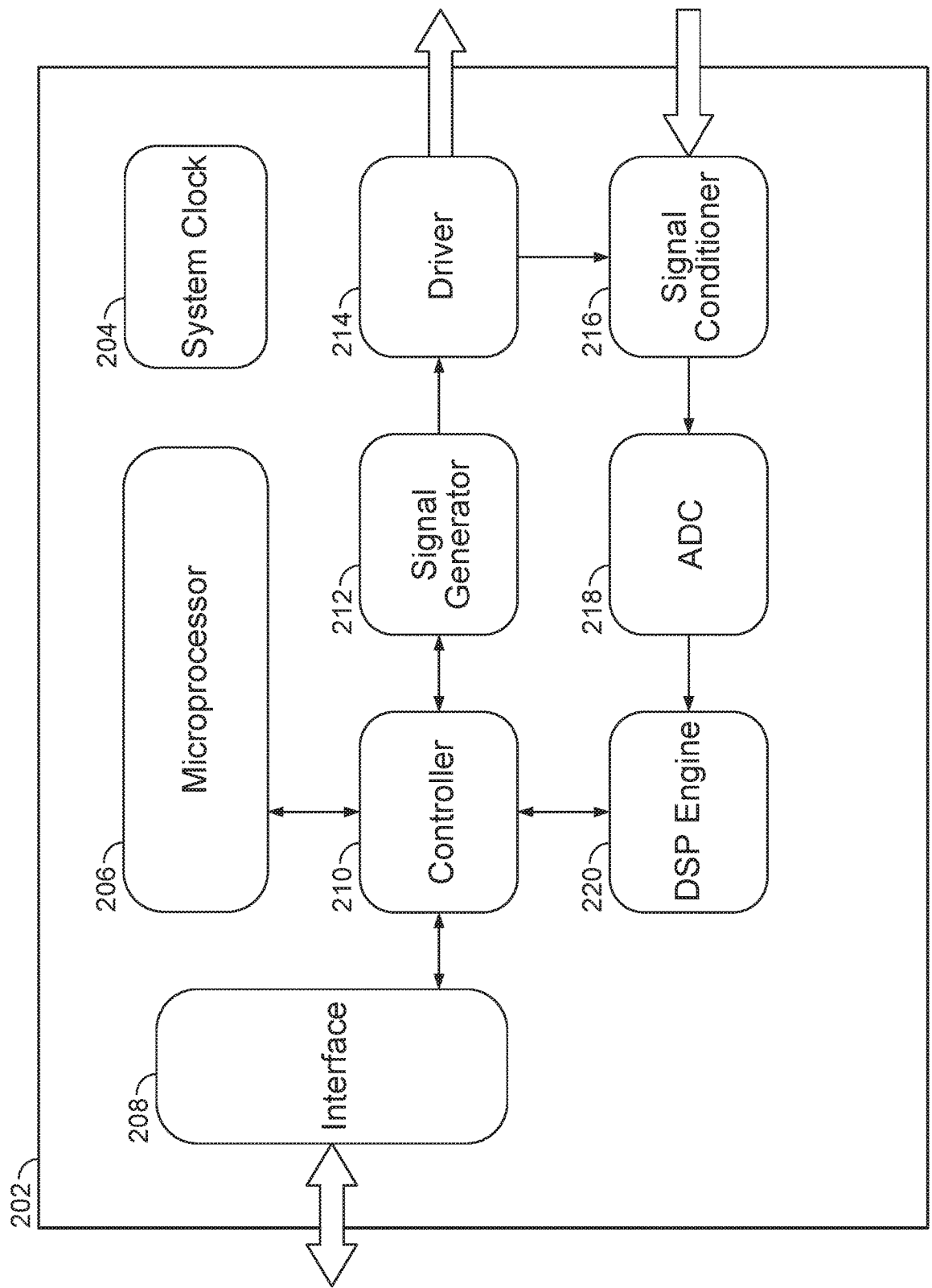
FIG. 2 is a block diagram illustrating an embodiment of a system for detecting a touch input.

FIG. 2 is a block diagram illustrating an embodiment of a system for detecting a touch input. In some embodiments, touch detector 202 is included in touch detector 120 of FIG. 1. In some embodiments, the system of FIG. 2 is integrated in an integrated circuit chip. Touch detector 202 includes system clock 204 that provides a synchronous system time source to one or more other components of detector 202. Controller 210 controls data flow and/or commands between microprocessor 206, interface 208, DSP engine 220, and signal generator 212. In some embodiments, microprocessor 206 processes instructions and/or calculations that can be used to program software/firmware and/or process data of detector 202. In some embodiments, a memory is coupled to microprocessor 206 and is configured to provide microprocessor 206 with instructions. Signal generator 212 generates a signal to be used to propagate a signal such as a signal propagated by transmitter 104 of FIG. 1. For example, signal generator 212 generates a pseudorandom binary sequence signal. Driver 214 receives the signal from generator 212 and drives one or more transmitters, such as transmitters 104, 106, 108, and 110 of FIG. 1, to propagate a signal through a medium.

A signal detected from a sensor such as sensor 112 of FIG. 1 is received by detector 202 and signal conditioner 216 conditions (e.g., filters) the received analog signal for further processing. For example, signal conditioner 216 receives the signal outputted by driver 214 and performs echo cancellation of the signal received by signal conditioner 216. The conditioned signal is converted to a digital signal by analog-to-digital converter 218. The converted signal is processed by digital signal processor engine 220. For example, DSP engine 220 correlates the converted signal against a reference signal. The result of the correlation may be used by microprocessor 206 to determine a location associated with a user touch input. In some embodiments, the DSP engine determines an amplitude change associated with the converted signal and a reference signal. The amplitude change may be used by microprocessor 206 to determine a force associated with a user touch input. Interface 208 provides an interface for microprocessor 206 and controller 210 that allows an external component to access and/or control detector 202. For example, interface 208 allows detector 202 to communicate with application system 122 of FIG. 1 and provides the application system with location information associated with a user touch input.

Figure 3:
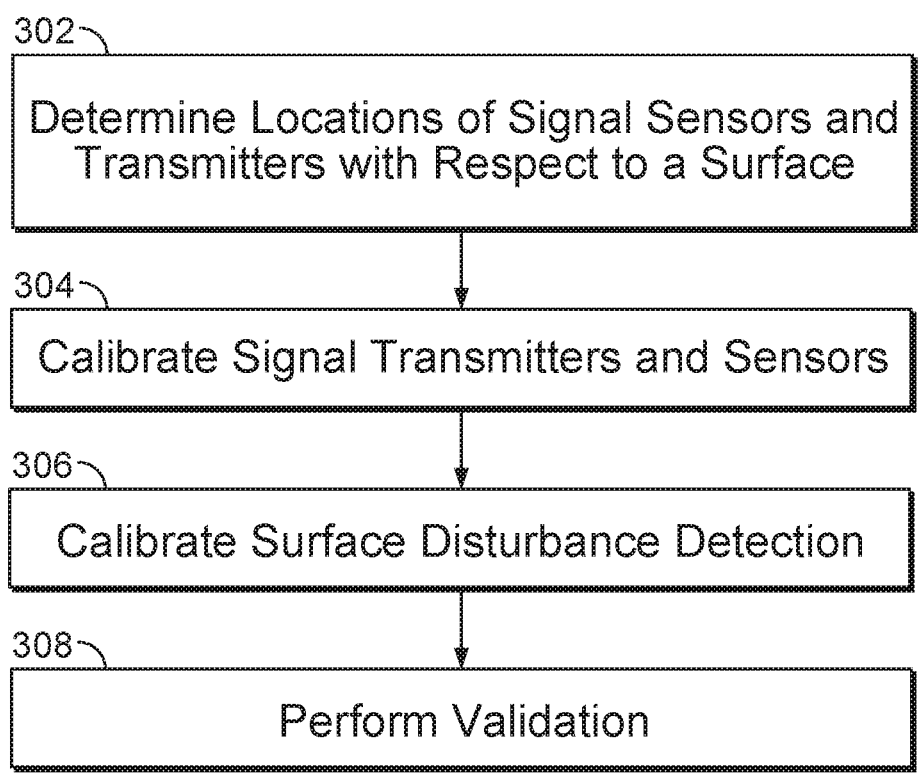
FIG. 3 is a flow chart illustrating an embodiment of a process for calibrating and validating touch detection.

FIG. 3 is a flow chart illustrating an embodiment of a process for calibrating and validating touch detection. In some embodiments, the process of FIG. 3 is used at least in part to calibrate and validate the system of FIG. 1 and/or the system of FIG. 2. At 302, locations of signal transmitters and sensors with respect to a surface are determined. For example, locations of transmitters and sensors shown in FIG. 1 are determined with respect to their location on a surface of medium 102. In some embodiments, determining the locations includes receiving location information. In various embodiments, one or more of the locations may be fixed and/or variable.

At 304, signal transmitters and sensors are calibrated. In some embodiments, calibrating the transmitter includes calibrating a characteristic of a signal driver and/or transmitter (e.g., strength). In some embodiments, calibrating the sensor includes calibrating a characteristic of a sensor (e.g., sensitivity). In some embodiments, the calibration of 304 is performed to optimize the coverage and improve signal-to-noise transmission/detection of a signal (e.g., acoustic or ultrasonic) to be propagated through a medium and/or a disturbance to be detected. For example, one or more components of the system of FIG. 1 and/or the system of FIG. 2 are tuned to meet a signal-to-noise requirement. In some embodiments, the calibration of 304 depends on the size and type of a transmission/propagation medium and geometric configuration of the transmitters/sensors. In some embodiments, the calibration of step 304 includes detecting a failure or aging of a transmitter or sensor. In some embodiments, the calibration of step 304 includes cycling the transmitter and/or receiver. For example, to increase the stability and reliability of a piezoelectric transmitter and/or receiver, a burn-in cycle is performed using a burn-in signal. In some embodiments, the step of 304 includes configuring at least one sensing device within a vicinity of a predetermined spatial region to capture an indication associated with a disturbance using the sensing device. The disturbance is caused in a selected portion of the input signal corresponding to a selection portion of the predetermined spatial region.

At 306, surface disturbance detection is calibrated. In some embodiments, a test signal is propagated through a medium such as medium 102 of FIG. 1 to determine an expected sensed signal when no disturbance has been applied. In some embodiments, a test signal is propagated through a medium to determine a sensed signal when one or more predetermined disturbances (e.g., predetermined touch) are applied at a predetermined location. Using the sensed signal, one or more components may be adjusted to calibrate the disturbance detection.

At 308, a validation of a touch detection system is performed. For example, the system of FIG. 1 and/or FIG. 2 is testing using predetermined disturbance patterns to determine detection accuracy, detection resolution, multi-touch detection, and/or response time. If the validation fails, the process of FIG. 3 may be at least in part repeated and/or one or more components may be adjusted before performing another validation.

Figure 4:
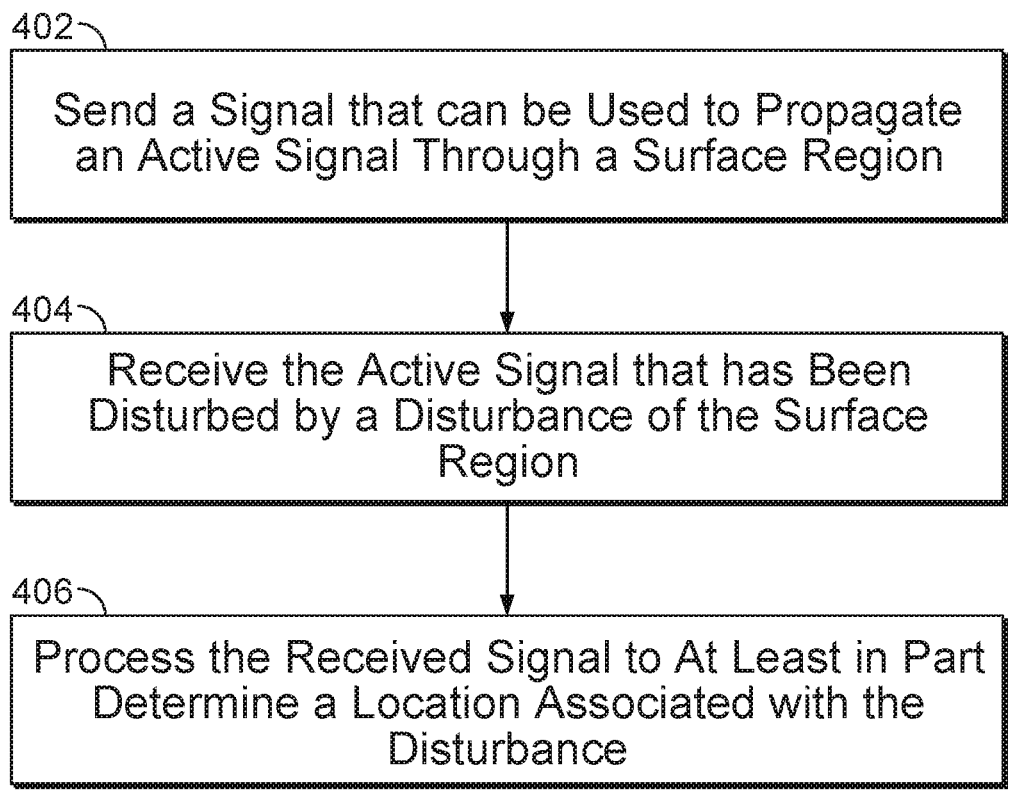
FIG. 4 is a flow chart illustrating an embodiment of a process for detecting a user touch input.

FIG. 4 is a flow chart illustrating an embodiment of a process for detecting a user touch input. In some embodiments, the process of FIG. 4 is at least in part implemented on touch detector 120 of FIG. 1 and/or touch detector 202 of FIG. 2. At 402, a signal that can be used to propagate an active signal through a surface region is sent. In some embodiments, sending the signal includes driving (e.g., using driver 214 of FIG. 2) a transmitter such as a transducer (e.g., transmitter 104 of FIG. 1) to propagate an active signal (e.g., acoustic or ultrasonic) through a propagating medium with the surface region. In some embodiments, the signal includes a sequence selected to optimize autocorrelation (e.g., resulting in narrow/short peak) of the signal. For example, the signal includes a Zadoff-Chu sequence. In some embodiments, the signal includes a pseudorandom binary sequence with or without modulation. In some embodiments, the propagated signal is an acoustic signal. In some embodiments, the propagated signal is an ultrasonic signal (e.g., outside the range of human hearing). For example, the propagated signal is a signal above 20 kHz (e.g., within the range between 80 kHz to 100 kHz). In other embodiments, the propagated signal may be within the range of human hearing. In some embodiments, by using the active signal, a user input on or near the surface region can be detected by detecting disturbances in the active signal when it is received by a sensor on the propagating medium. By using an active signal rather than merely listening passively for a user touch indication on the surface, other vibrations and disturbances that are not likely associated with a user touch indication can be more easily discerned/filtered out. In some embodiments, the active signal is used in addition to receiving a passive signal from a user input to determine the user input.

At 404, the active signal that has been disturbed by a disturbance of the surface region is received. The disturbance may be associated with a user touch indication. In some embodiments, the disturbance causes the active signal that is propagating through a medium to be attenuated and/or delayed. In some embodiments, the disturbance in a selected portion of the active signal corresponds to a location on the surface that has been indicated (e.g., touched) by a user.

At 406, the received signal is processed to at least in part determine a location associated with the disturbance. In some embodiments, determining the location includes extracting a desired signal from the received signal at least in part by removing or reducing undesired components of the received signal such as disturbances caused by extraneous noise and vibrations not useful in detecting a touch input. In some embodiments, determining the location includes comparing the received signal to a reference signal that has not been affected by the disturbance. The result of the comparison may be used with a result of other comparisons performed using the reference signal and other signal(s) received at a plurality of sensors. The location, in some embodiments, is a location (e.g., a location coordinate) on the surface region where a user has provided a touch input. In addition to determining the location, one or more of the following information associated with the disturbance may be determined at 406: a gesture, simultaneous user indications (e.g., multi-touch input), a time, a status, a direction, a velocity, a force magnitude, a proximity magnitude, a pressure, a size, and other measurable or derived information. In some embodiments, the location is not determined at 406 if a location cannot be determined using the received signal and/or the disturbance is determined to be not associated with a user input. Information determined at 406 may be provided and/or outputted.

Although FIG. 4 shows receiving and processing an active signal that has been disturbed, in some embodiments, a received signal has not been disturbed by a touch input and the received signal is processed to determine that a touch input has not been detected. An indication that a touch input has not been detected may be provided/outputted.

Figure 5:
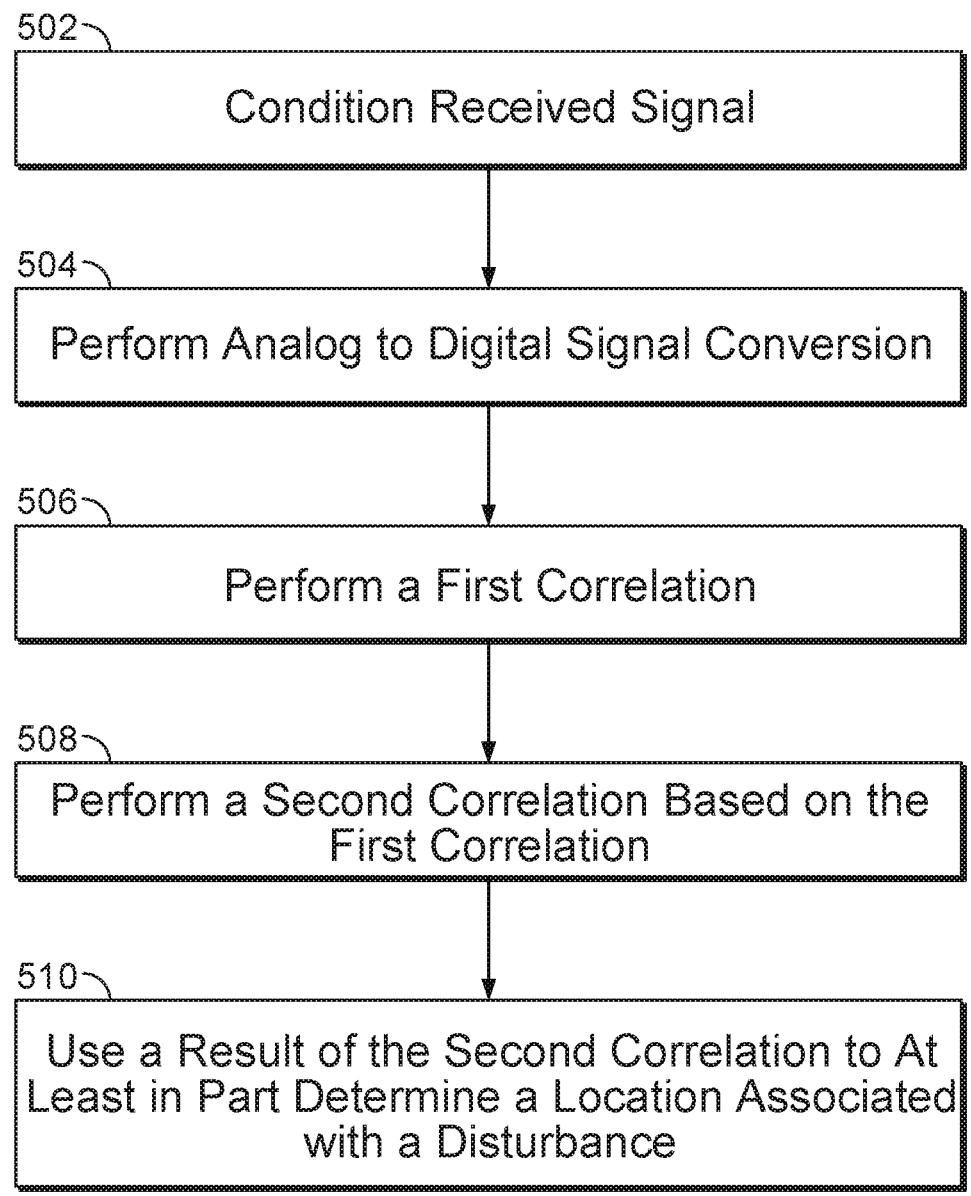
FIG. 5 is a flow chart illustrating an embodiment of a process for determining a location associated with a disturbance on a surface.

FIG. 5 is a flow chart illustrating an embodiment of a process for determining a location associated with a disturbance on a surface. In some embodiments, the process of FIG. 5 is included in 406 of FIG. 4. The process of FIG. 5 may be implemented in touch detector 120 of FIG. 1 and/or touch detector 202 of FIG. 2. At 502, a received signal is conditioned. In some embodiments, the received signal is a signal including a pseudorandom binary sequence that has been freely propagated through a medium with a surface that can be used to receive a user input. For example, the received signal is the signal that has been received at 404 of FIG. 4. In some embodiments, conditioning the signal includes filtering or otherwise modifying the received signal to improve signal quality (e.g., signal-to-noise ratio) for detection of a pseudorandom binary sequence included in the received signal and/or user touch input. In some embodiments, conditioning the received signal includes filtering out from the signal extraneous noise and/or vibrations not likely associated with a user touch indication.

At 504, an analog to digital signal conversion is performed on the signal that has been conditioned at 502. In various embodiments, any number of standard analog to digital signal converters may be used. The resulting digital signal is used to perform a first correlation at 506. In some embodiments, performing the first correlation includes correlating the converted signal with a reference signal. Performing the correlation includes cross-correlating or determining a convolution (e.g., interferometry) of the converted signal with a reference signal to measure the similarity of the two signals as a time-lag is applied to one of the signals. By performing the correlation, the location of a portion of the converted signal that most corresponds to the reference signal can be located. For example, a result of the correlation can be plotted as a graph of time within the received and converted signal (e.g., time-lag between the signals) vs. a measure of similarity. The associated time value of the largest value of the measure of similarity corresponds to the location where the two signals most correspond. By comparing this measured time value against a reference time value (e.g., at 306 of FIG. 3) not associated with a touch indication disturbance, a time delay/offset or phase difference caused on the received signal due to a disturbance caused by a touch input can be determined. In some embodiments, by measuring the amplitude/intensity difference of the received signal at the determined time vs. a reference signal, a force associated with a touch indication may be determined. In some embodiments, the reference signal is determined based at least in part on the signal that was propagated through a medium (e.g., based on a source pseudorandom binary sequence signal that was propagated). In some embodiments, the reference signal is at least in part determined using information determined during calibration at 306 of FIG. 3. The reference signal may be chosen so that calculations required to be performed during the correlation may be simplified. For example, the reference signal used in 506 is a simplified reference signal that can be used to efficiently correlate the reference signal over a relatively large time difference (e.g., lag-time) between the received and converted signal and the reference signal.

At 508, a second correlation is performed based on a result of the first correlation. Performing the second correlation includes correlating (e.g., cross-correlation or convolution similar to step 506) the converted signal in 504 with a second reference signal. The second reference signal is a more complex/detailed (e.g., more computationally intensive) reference signal as compared to the first reference signal used in 506. In some embodiments, the second correlation is performed in 508 because using the second reference signal in 506 may be too computationally intensive for the time interval required to be correlated in 506. Performing the second correlation based on the result of the first correlation includes using one or more time values determined as a result of the first correlation. For example, using a result of the first correlation, a range of likely time values (e.g., time-lag) that most correlate between the received signal and the first reference signal is determined and the second correlation is performed using the second reference signal only across the determined range of time values to fine tune and determine the time value that most corresponds to where the second reference signal (and, by association, also the first reference signal) matched the received signal. In various embodiments, the first and second correlations have been used to determine a portion within the received signal that correspond to a disturbance caused by a touch input at a location on a surface of a propagating medium. In other embodiments, the second correlation is optional. For example, only a single correlation step is performed.

At 510, a result of the second correlation is used to at least in part determine a location associated with a disturbance. In some embodiments, determining the location includes comparing a determined time value where the signals of the second correlation are most correlated and comparing the determined time value with a reference time value (e.g., determined at 306 of FIG. 3) not associated with a touch input disturbance, to determine a time delay/offset or phase difference caused on the received signal due to the disturbance (e.g., caused by a touch input). This time delay is associated with a signal received at a first sensor and other time delays due to the disturbance at other signals received at other sensors are used to calculate a location of the disturbance relative to the locations of the sensors. By using the location of the sensors relative to a surface of a medium that has propagated the received signal, a location on the surface where the disturbance originated may be determined.

Figure 6:
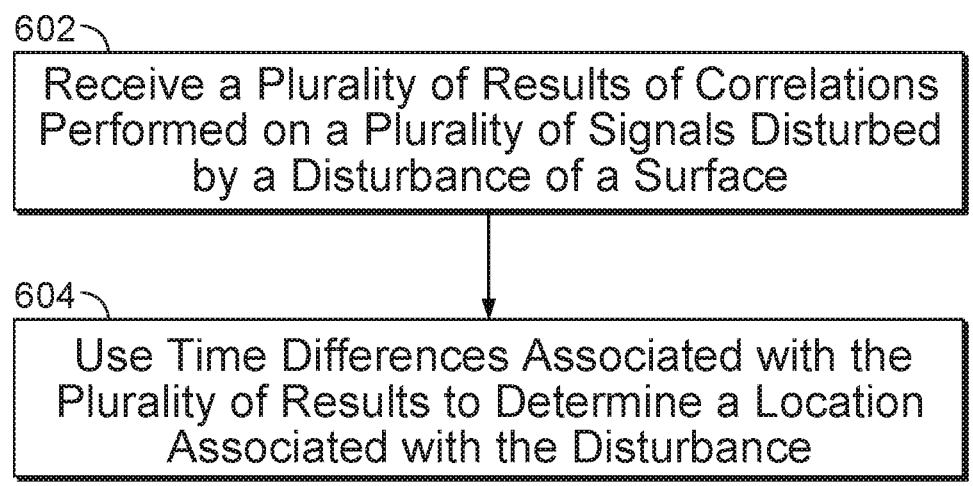
FIG. 6 is a flow chart illustrating an embodiment of a process for determining a location associated with a disturbance.

FIG. 6 is a flowchart illustrating an embodiment of a process for determining a location associated with a disturbance. In some embodiments, the process of FIG. 6 is included in 510 of FIG. 5. At 602, a plurality of results of correlations performed on a plurality of signals disturbed by a disturbance of a surface is received. For example, a result of the correlation performed at 508 of FIG. 5 is received. In some embodiments, a signal is propagated using transmitter 104 and sensors 114, 116, and 118 each receives the propagated signal that has been disturbed by a touch input on or near a surface of medium 102 of FIG. 1. The propagated signal may contain a predetermined signal and the predetermined signal is received at the various sensors. Each of the received signals is correlated with a reference signal to determine the results received at 602. In some embodiments, the received results are associated with a same signal content (e.g., same binary sequence) that has been freely propagated on a medium at the same time. In some embodiments, the received results are associated with different signal contents that have been disturbed by the same disturbance.

At 604, time differences associated with the plurality of results are used to determine a location associated with the disturbance. In some embodiments, each of the time differences is associated with a time when signals used in the correlation are most correlated. In some embodiments, the time differences are associated with a determined time delay/offset or phase difference caused on the received signal due to the disturbance. This time delay may be calculated by comparing a time value determined using a correlation with a reference time value that is associated with a scenario where a touch input has not been specified. The result of the comparison may be used to calculate a location of the disturbance relative to the locations of sensors that received the plurality of signals. By using the location of the sensors relative to a surface of a medium that has propagated the received signal, a location on the surface where the disturbance originated may be determined.

Figure 7:
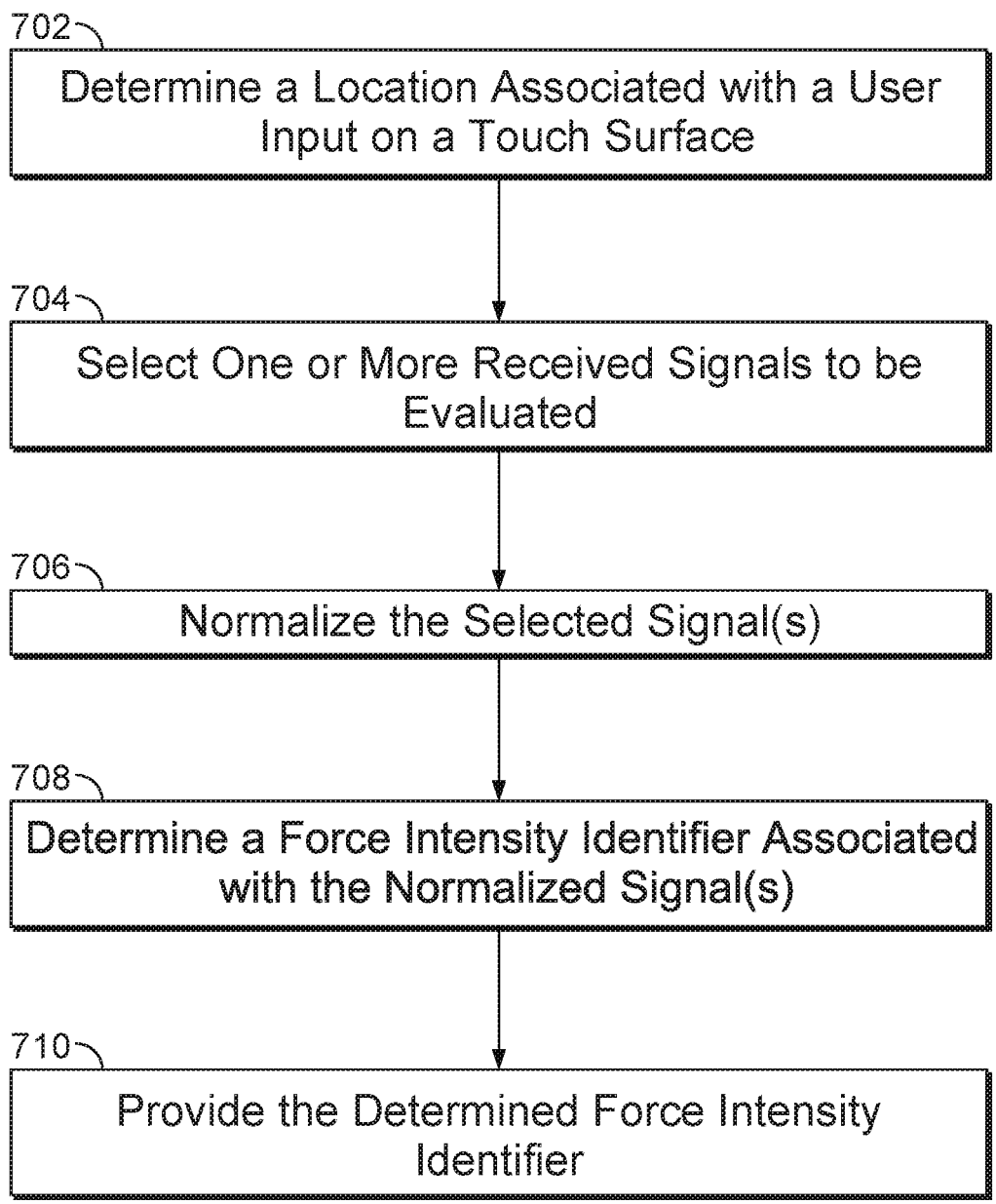
FIG. 7 is a flowchart illustrating an embodiment of a process of determining a force associated with a user input.

FIG. 7 is a flowchart illustrating an embodiment of a process of determining a force associated with a user input. The process of FIG. 7 may be implemented on touch detector 120 of FIG. 1 and/or touch detector 202 of FIG. 2.

At 702, a location associated with a user input on a touch input surface is determined. In some embodiments, at least a portion of the process of FIG. 4 is included in step 702. For example, the process of FIG. 4 is used to determine a location associated with a user touch input. In another example, a location associated with a user input at location 130 on a surface of medium 102 of FIG. 1 is determined.

At 704, one or more received signals are selected to be evaluated. In some embodiments, selecting the signal(s) to be evaluated include selecting one or more desired signals from a plurality of received signals used to detect the location associated with the user input. For example, one or more signals received in step 404 of FIG. 4 are selected. In some embodiments, the selected signal(s) are selected based at least in part on a signal-to-noise ratio associated with signals. In some embodiments, one or more signals with the highest signal-to-noise ratio are selected. For example, when an active signal that is propagated through a touch input surface medium is disturbed/scattered by a touch input, the disturbed signal is detected/received at various detectors/sensors/receivers coupled to the medium. The received disturbed signals may be subject to other undesirable disturbances such as other minor vibration sources (e.g., due to external audio vibration, device movement, etc.) that also disturb the active signal. The effects of these undesirable disturbances may be larger on received signals that were received further away from the location of the touch input.

In some embodiments, a variation (e.g., disturbance such as amplitude change) detected in an active signal received at a receiver/sensor may be greater at certain receivers (e.g., receivers located closest to the location of the touch input) as compared to other receivers. For example, in the example of FIG. 1, touch input at location 130 disturbs an active signal sent by transmitter 104. The disturbed active signal is received at sensors/receivers 112, 114, 116, and 118. Because sensor/receiver 114 is located closest to touch input location 130, it has received a disturbed signal with the largest amplitude variation that is proportional to the force of the touch input. In some embodiments, the selected signals may have been selected at least in part by examining the amplitude of a detected disturbance. For example, one or more signals with the highest amplitude associated with a detected touch input disturbance are selected. In some embodiments, based at least in part on a location determined in 702, one or more signals received at one or more receivers located closest to the touch input location are selected. In some embodiments, a plurality of active signals is used to detect a touch input location and/or touch input force intensity. One or more received signals to be used to determine a force intensity may be selected for each of the active signals. In some embodiments, one or more received signals to be used to determine the force intensity may be selected across the received signals of all the active signals.

At 706, the one or more selected signals are normalized. In some embodiments, normalizing a selected signal includes adjusting (e.g., scaling) an amplitude of the selected signal based on a distance value associated with the selected signal. For example, although an amount/intensity of force of a touch input may be detected by measuring an amplitude of a received active signal that has been disturbed by the force of the touch input, other factors such as the location of the touch input with respect to a receiver that has received the disturbed signal and/or location of the transmitter transmitting the active signal may also affect the amplitude of the received signal used to determine the intensity of the force. In some embodiments, a distance value/identifier associated with one or more of the following is used to determine a scaling factor used to scale a selected signal: a distance between a location of a touch input and a location of a receiver that has received the selected signal, a distance between a location of a touch input and a location of a transmitter that has transmitted an active signal that has been disturbed by a touch input and received as the selected signal, a distance between a location of a receiver that has received the selected signal and a location of a transmitter that has transmitted an active signal that has been disturbed by a touch input and received as the selected signal, and a combined distance of a first distance between a location of a touch input and a location of a receiver that has received the selected signal and a second distance between the location of the touch input and a location of a transmitter that has transmitted an active signal that has been disturbed by a touch input and received as the selected signal. In some embodiments, each of one or more selected signals is normalized by a different amount (e.g., different amplitude scaling factors).

At 708, a force intensity identifier associated with the one or more normalized signals is determined. The force intensity identifier may include a numerical value and/or other identifier identifying a force intensity. In some embodiments, if a plurality of normalized signals is used, an associated force may be determined for each normalized signal and the determined forces may be averaged and/or weighted-averaged to determine the amount of the force. For example, in the case of weighted averaging of the force values, each determined force value is weighted based on an associated signal-to-noise ratio, an associated amplitude value, and/or an associated distance value between a receiver of the normalized signal and the location of the touch input.

In some embodiments, the amount of force is determined using a measured amplitude associated with a disturbed portion of the normalized signal. For example, the normalized signal represents a received active signal that has been disturbed when a touch input was provided on a surface of a medium that was propagating the active signal. A reference signal may indicate a reference amplitude of a received active signal if the active signal was not disturbed by a touch input. In some embodiments, an amplitude value associated with an amplitude change to the normalized signal caused by a force intensity of a touch input is determined. For example, the amplitude value may be a measured amplitude of a disturbance detected in a normalized signal or a difference between a reference amplitude and the measured amplitude of the disturbance detected in the normalized signal. In some embodiments, the amplitude value is used to obtain an amount/intensity of a force.

In some embodiments, the use of the amplitude value includes using the amplitude value to look up in a data structure (e.g., table, database, chart, graph, lookup table, list, etc.) a corresponding associated force intensity. For example, the data structure includes entries associating a signal disturbance amplitude value and a corresponding force intensity identifier. The data structure may be predetermined/pre-computed. For example, for a given device, a controlled amount of force is applied and the disturbance effect on an active signal due to the controlled amount of force is measured to determine an entry for the data structure. The force intensity may be varied to determine other entries of the data structure. In some embodiments, the data structure is associated with a specific receiver that received the signal included in the normalized signal. For example, the data structure includes data that has been specifically determined for characteristics of a specific receiver (e.g., for sensor/receiver 114 of FIG. 1). In some embodiments, the use of the amplitude value to look up a corresponding force intensity identifier stored in a data structure includes selecting a specific data structure and/or a specific portion of a data structure corresponding to the normalized signal and/or a receiver that received the signal included in the normalized signal. In some embodiments, the data structure is associated with a plurality of receivers. For example, the data structure includes entries associated with averages of data determined for characteristics of each receiver in the plurality of receivers. In this example, the same data structure may be used for a plurality of normalized signals associated with various receivers.

In some embodiments, the use of the amplitude value includes using the amplitude value in a formula that can be used to simulate and/or calculate a corresponding force intensity. For example, the amplitude value is used as an input to a predetermined formula used to compute a corresponding force intensity. In some embodiments, the formula is associated with a specific receiver that received the signal of the normalized signal. For example, the formula includes one or more parameters (e.g., coefficients) that have been specifically determined for characteristics of a specific receiver (e.g., for sensor/receiver 114 of FIG. 1). In some embodiments, the use of the amplitude value in a formula calculation includes selecting a specific formula corresponding to the normalized signal and/or a receiver that received the signal included in the normalized signal. In some embodiments, a single formula is associated with a plurality of receivers. For example, a formula includes averaged parameter values of parameter values that have been specifically determined for characteristics for each of the receivers in the plurality of receivers. In this example, the same formula may be used for a plurality of normalized signals associated with different receivers.

At 710, the determined force intensity identifier is provided. In some embodiments, providing the force intensity identifier includes providing the identifier (e.g., a numerical value, an identifier within a scale, etc.) to an application such as an application of application system 122 of FIG. 1. In some embodiments, the provided force intensity identifier is provided with a corresponding touch input location identifier determined in step 406 of FIG. 4. In some embodiments, the provided force intensity identifier is used to provide a user interface interaction.

Figure 8:
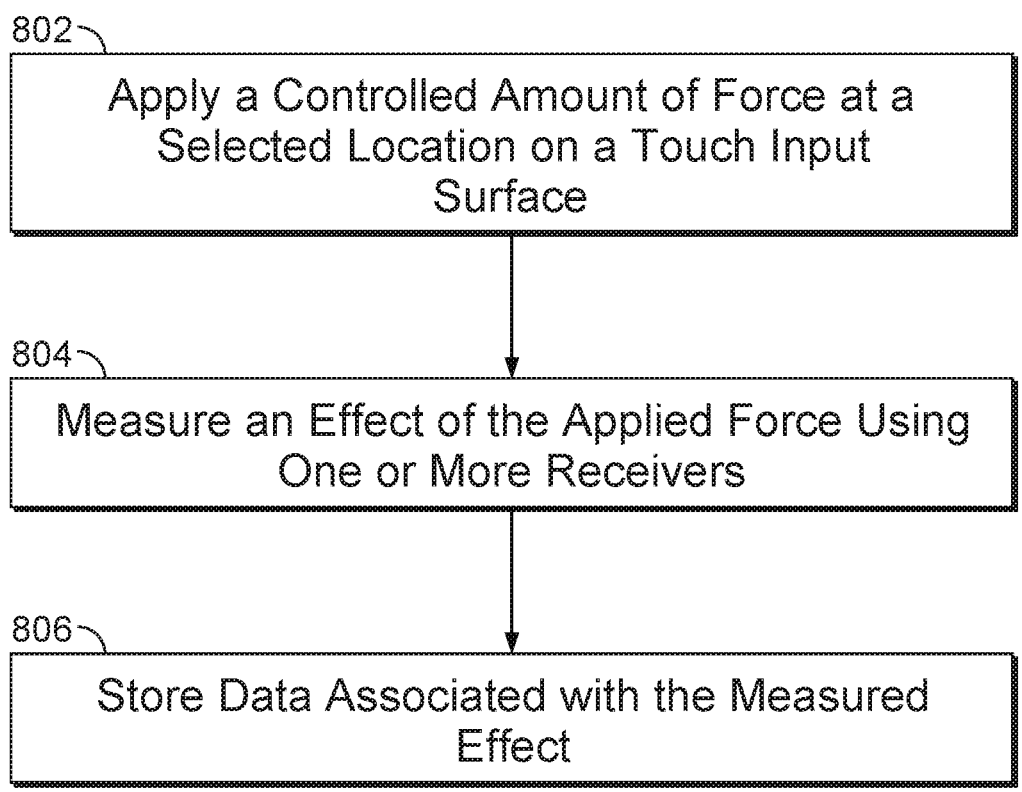
FIG. 8 is a flowchart illustrating an embodiment of a process for determining an entry of a data structure used to determine a force intensity identifier.

FIG. 8 is a flowchart illustrating an embodiment of a process for determining an entry of a data structure used to determine a force intensity identifier. In some embodiments, the process of FIG. 8 is included in step 304 of FIG. 3. In some embodiments, the process of FIG. 8 is used at least in part to create the data structure that may be used in step 708 of FIG. 7. In some embodiments, the process of FIG. 8 is used at least in part to calibrate the system of FIG. 1 and/or the system of FIG. 2. In some embodiments, the process of FIG. 8 is used at least in part to determine a data structure that can be included in one or more devices to be manufactured to determine a force intensity identifier/value corresponding to an amplitude value of a disturbance detected in the received active signal. For example, the data structure may be determined for a plurality of similar devices to be manufactured or the data structure may be determined for a specific device taking into account the manufacturing variation of the device.

At 802, a controlled amount of force is applied at a selected location on a touch input surface. In some embodiments, the force is provided on a location of a surface of medium 102 of FIG. 1 where a touch input may be provided. In some embodiments, a tip of a pointer (e.g., stylus) is pressing at the surface with a controllable amount of force. For example, a controlled amount of force is applied on a touch input surface while an active signal is being propagated through a medium of the touch input surface. The amount of force applied in 802 may be one of a plurality of different amounts of force that will be applied on the touch input surface.

At 804, an effect of the applied force is measured using one or more receivers. Examples of the receivers include sensors 112-118 of FIG. 1 and transducer transmitters used as receivers (e.g., transmitters 104-110 of FIG. 1). In some embodiments, measuring the effect includes measuring an amplitude associated with a disturbed portion of an active signal that has been disturbed when the force was applied in 802 and that has been received by the one or more receivers. The amplitude may be a directly measured amplitude value or a difference between a reference amplitude and a detected amplitude. In some embodiments, the signal received by the one or more receivers is normalized before the amplitude is measured. In some embodiments, normalizing a received signal includes adjusting (e.g., scaling) an amplitude of the signal based on a distance value associated with the selected signal.

A reference signal may indicate a reference amplitude of a received active signal that has not been disturbed by a touch input. In some embodiments, an amplitude value associated with an amplitude change caused by a disturbance of a touch input is determined. For example, the amplitude value may be a measured amplitude value of a disturbance detected in a normalized signal or a difference between a reference amplitude and the measured amplitude value of the disturbance detected in the normalized signal. In some embodiments, the amplitude value is used to obtain an identifier of a force intensity.

In some embodiments, a distance value associated with one or more of the following is used to determine a scaling factor used to scale a received signal before an effect of a disturbance is measured using the received signal: a distance between a location of a touch input and a location of a receiver that has received the selected signal, a distance between a location of the force input and a location of a transmitter that has transmitted an active signal that has been disturbed by the force input and received by the receiver, a distance between a location of the receiver and a location of a transmitter that has transmitted an active signal that has been disturbed by the force input and received by the receiver, and a combined distance of a first distance between a location of a force input and a location of the receiver and a second distance between the location of the force input and a location of a transmitter that has transmitted an active signal that has been disturbed by the force input and received by the receiver. In some embodiments, each of one or more signals received by different receivers is normalized by a different amount (e.g., different amplitude scaling factors).

At 806, data associated with the measured effect is stored. In some embodiments, storing the data includes storing an entry in a data structure such as the data structure that may be used in step 708 of FIG. 7. For example, an entry that associates the amplitude value determined in 804 and an identifier associated with an amount of force applied in 802 is stored in the data structure. In some embodiments, storing the data includes indexing the data by an amplitude value determined in 804. For example, the stored data may be retrieved from the storage using the amplitude value. In some embodiments, the data structure is determined for a specific signal receiver. In some embodiments, a data structure is determined for a plurality of signal receivers. For example, data associated with the measured effect on signals received at each receiver of a plurality of receivers is averaged and stored. In some embodiments, storing the data includes storing the data in a format that can be used to generate a graph such as the graph of FIG. 9.

In some embodiments, the process of FIG. 8 is repeated for different applied force intensities, different receivers, different force application locations, and/or different types of applied forces (e.g., different force application tip). Data stored from the repeated execution of the steps of FIG. 8 may be used to fill the data structure that may be used in step 708 of FIG. 7.

Figure 9:
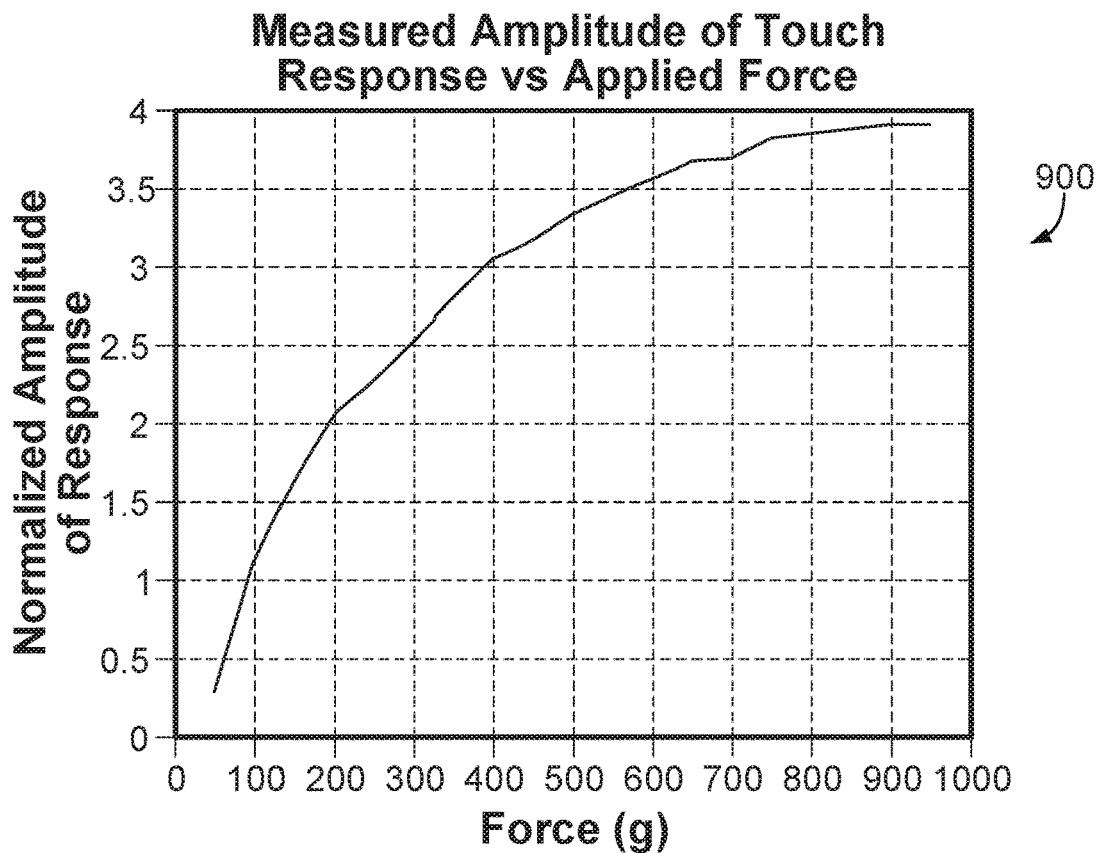
FIG. 9 includes graphs illustrating examples of a relationship between a normalized amplitude value of a measured disturbance and an applied force.
Figure 9:
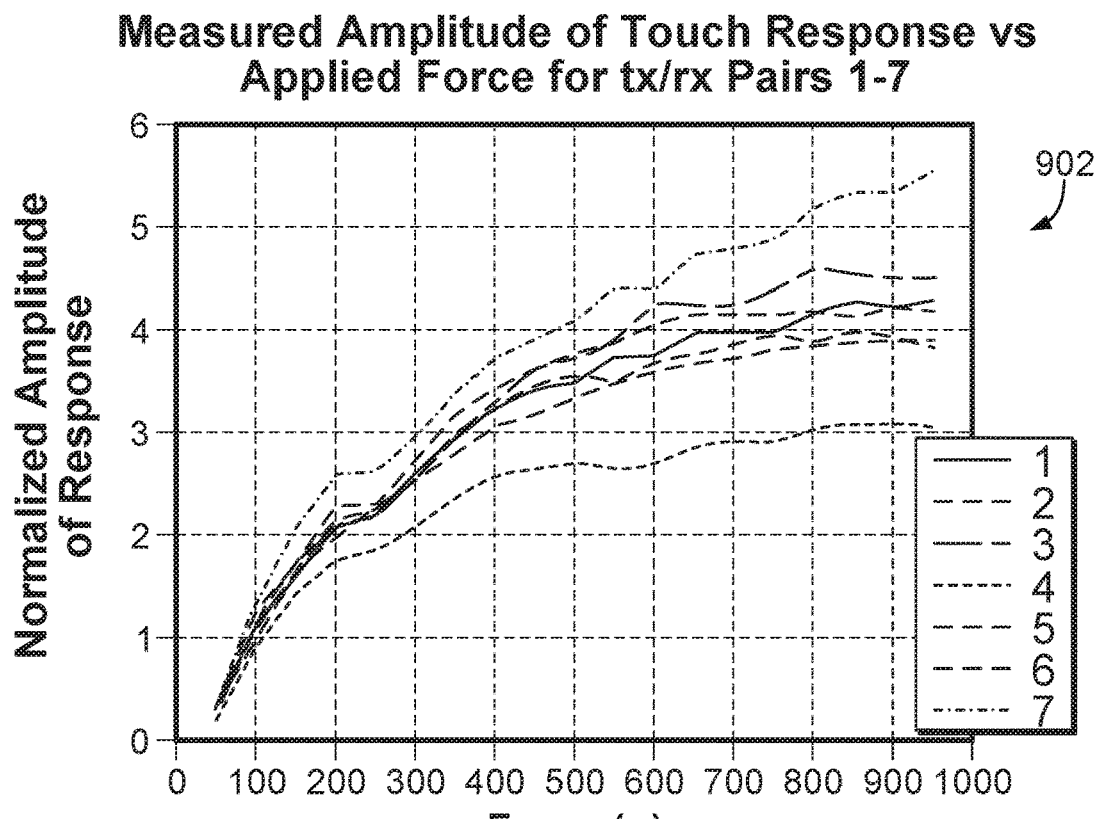

FIG. 9 includes graphs illustrating examples of a relationship between a normalized amplitude value of a measured disturbance and an applied force. Graph 900 plots an applied force intensity (in grams of force) of a touch input vs. a measured amplitude of a disturbance caused by the applied force for a single receiver. Graph 902 plots an applied force intensity of a touch input vs. a measured amplitude of a disturbance caused by the applied force for different receivers. The plots of the different receivers may be averaged and combined into a single plot. In some embodiments, graph 900 and/or graph 902 may be derived from data stored in the data structure that may be used in step 708 of FIG. 7. In some embodiments, graph 900 and/or graph 902 may be generated using data stored in step 806 of FIG. 8. Graphs 900 and 902 show that there exists an increasing functional relationship between measured amplitude and applied force. Using a predetermined graph, data structure, and/or formula that model this relationship, an associated force intensity identifier may be determined for a given amplitude value (e.g., such as in step 708 of FIG. 7).

Figure 10:
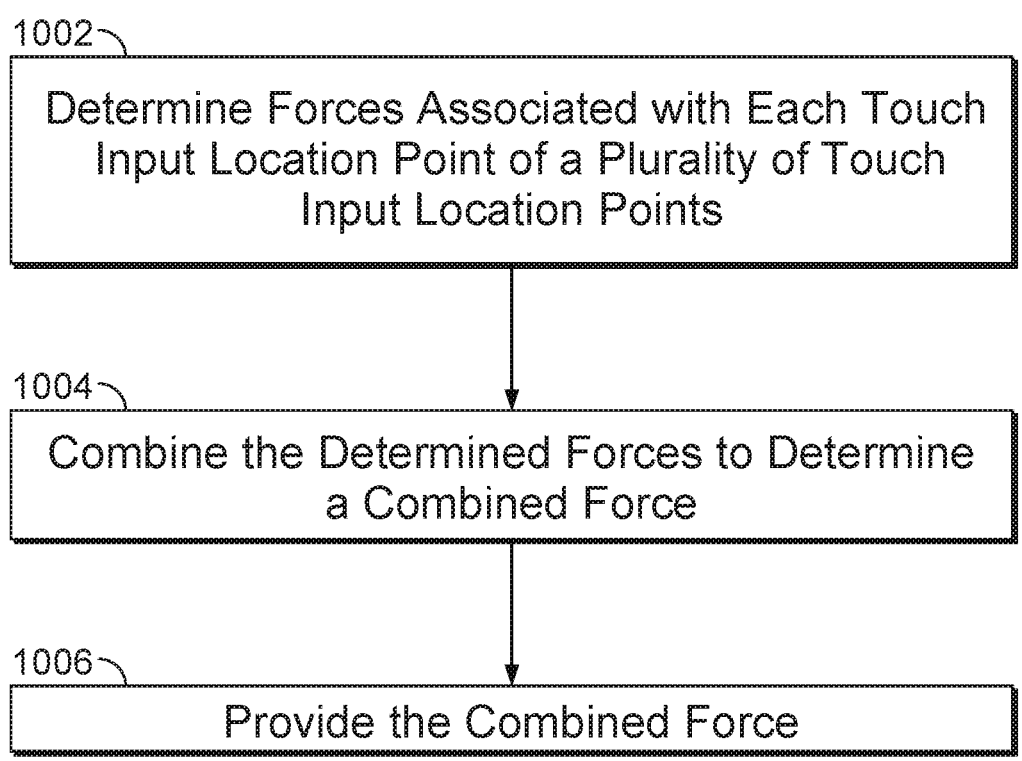
FIG. 10 is a flowchart illustrating an embodiment of a process for providing a combined force.

FIG. 10 is a flowchart illustrating an embodiment of a process for providing a combined force. The process of FIG. 10 may be implemented on touch detector 120 of FIG. 1 and/or touch detector 202 of FIG. 2.

At 1002, forces associated with each touch input location point of a plurality of touch input location points are determined. In some embodiments, a user touch input may be represented by a plurality of touch input locations (e.g., multi-touch input, touch input covering a relatively large area, etc.). In some embodiments, for each touch input location point, at least a portion of the process of FIG. 7 is used to determine an associated force. For example, a force intensity identifier is determined for each input location in the plurality of touch input locations.

At 1004, the determined forces are combined to determine a combined force. For example, the combined force represents a total amount of force applied on a touch input surface. In some embodiments, combining the forces includes adding a numerical representation of the forces together to determine the combined force. In some embodiments, a numerical representation of each determined force is weighted before being added together. For example, each numerical value of a determined force is weighted (e.g., multiplied by a scalar) based on an associated signal-to-noise ratio, an associated amplitude value, and/or an associated distance value between a receiver and a location of a touch input. In some embodiments, the weights of the forces being weighted must sum to the number of forces being combined.

At 1006, the combined force is provided. In some embodiments, providing the combined force includes providing a force intensity identifier to an application such as an application of application system 122 of FIG. 1. In some embodiments, provided combined force is used to provide a user interface interaction. In an alternative embodiment, rather than providing the combine force, the determined forces for each touch input location point of a plurality of touch input location points are provided.

Figure 11:
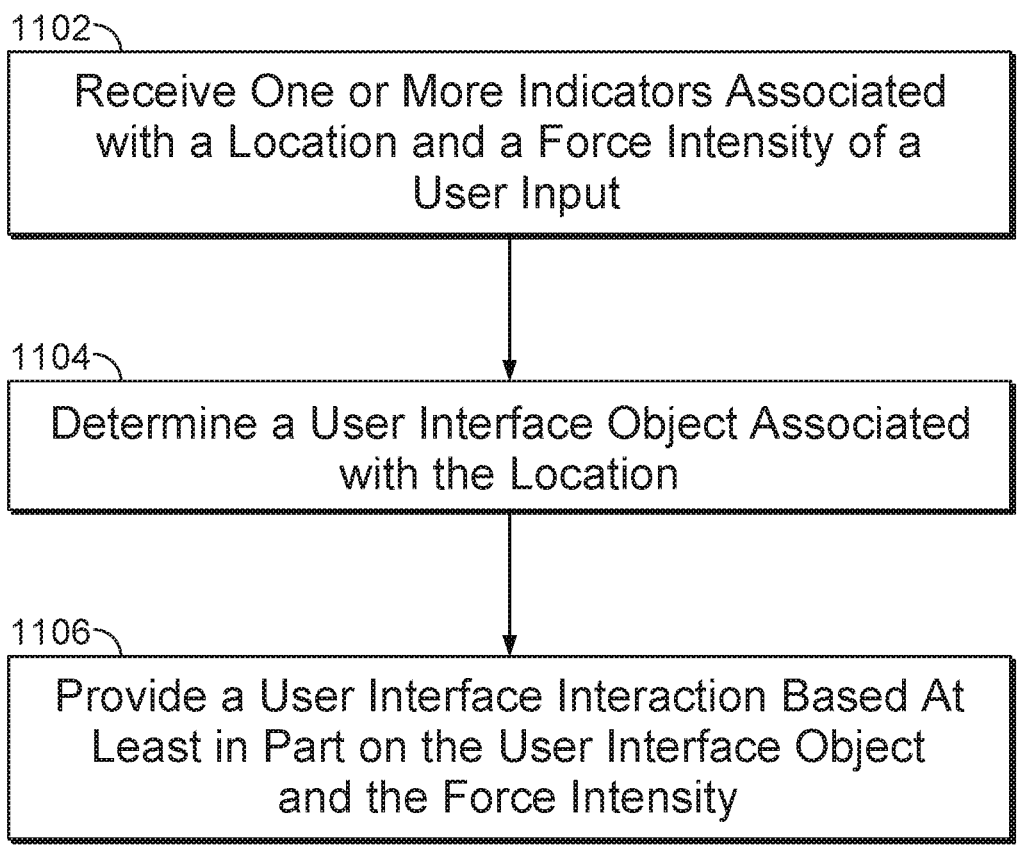
FIG. 11 is a flowchart illustrating an embodiment of a process for providing a user interface interaction.

FIG. 11 is a flowchart illustrating an embodiment of a process for providing a user interface interaction. The process of FIG. 11 may be implemented on touch detector 120 of FIG. 1 and/or touch detector 202 of FIG. 2.

At 1102, one or more indicators associated with a location and a force intensity of a user input are received. In some embodiments, the indicator(s) include data provided in step 710 of FIG. 7 and/or step 1006 of FIG. 10. In some embodiments, indicators associated with a sequence of locations and associated force intensities are received.

At 1104, a user interface object associated with the location is determined. In some embodiments, the user input is a touch screen user interface input and the user interface element desired to be indicated by the user input is determined. For example, the user input is detected at a location where an icon has been displayed and it is determined that a user has desired to select the user icon by providing a touch input at a location of the icon. In some embodiments, the user interface object includes an object displayed on a touchscreen. In some embodiments, the user interface object is not an object already displayed on a screen. For example, a hidden keyboard user interface object appears when a user touches a specific area of a touch input screen.

At 1106, a user interface interaction based at least in part on the user interface object and the force intensity is provided. For example, a user may indicate a desired user interface action by varying the amount of force applied on a touch input surface and the user interaction indicated by the received data in 1102 is provided. Examples of the possible user interface interactions are described in the following paragraphs.

Figure 12:
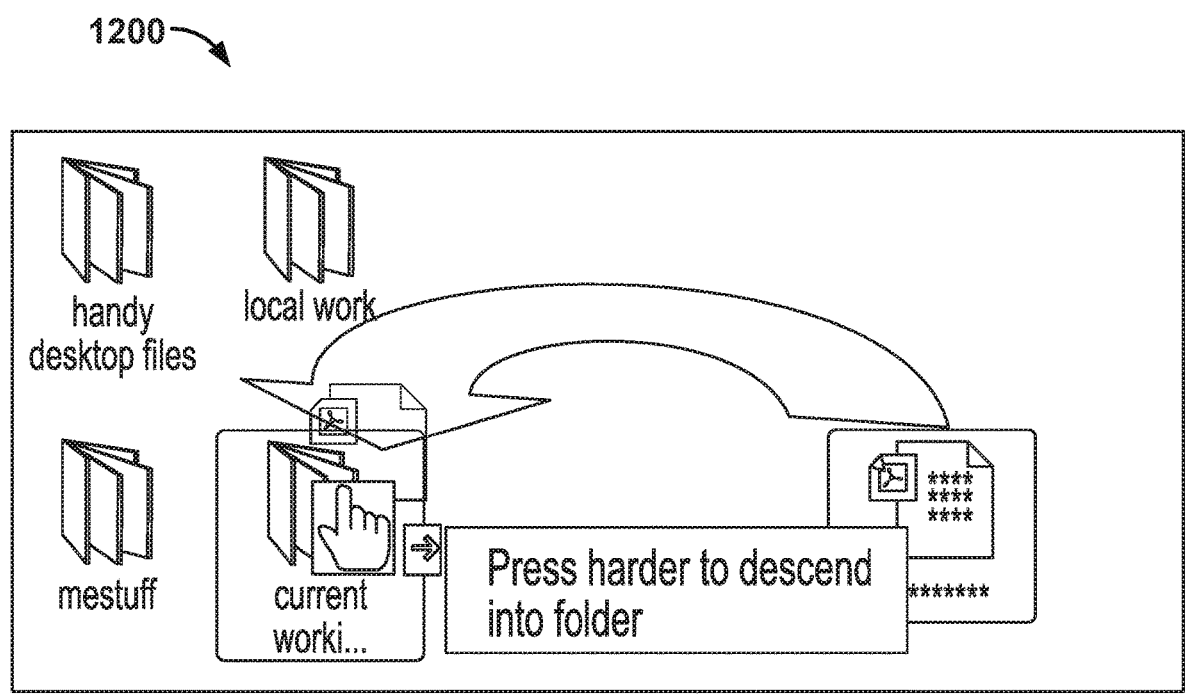
FIG. 12 is a diagram showing an example user interface interaction using force information to drag and drop an item into a file system folder.

FIG. 12 is a diagram showing an example user interface interaction using force information to drag and drop an item into a file system folder. In some embodiments, a user may drag a desired item (e.g., a file, a folder, a reference, a link, an object, etc.) by touching the desired item with a relatively "light" force applied to a pointer (e.g., finger, stylus, etc.) and dragging the pointer. A user may desire to drag and drop the desired item to a folder to move or copy the item into the folder. However if the user wants to drag and drop the desired item into a subfolder of the folder, a user typically has to open the folder to reveal the desired subfolder before dragging and dropping the desired item. In some embodiments, in order to move or copy an item to a subfolder of a displayed folder, a user may drag the desired item by touching the desired item with a relatively "light" force applied to a pointer (e.g., finger, stylus, etc.) and dragging the pointer to the displayed folder and applying a force intensity above a threshold level to descend into the subfolders of the displayed folder and releasing the pointer once a desired subfolder is found. As shown in diagram 1200, a file may be moved by a "light" touch input to an icon representing the file and dragging the touch input to a displayed folder and applying greater force intensity to the touch input to descend into the contents of the displayed folder until a desired destination subfolder is displayed. In some embodiments, by varying the amount of pressure of a touch input, a file system hierarchy may be explored. In some embodiments, a touch input force intensity greater than a first threshold level indicates a command to navigate into a lower file system hierarchy and a touch input force less than a second threshold level (in some cases, the second threshold level may be the same as the first threshold level) indicates a command to navigate to a higher file system hierarchy. The threshold levels may be preconfigured, dynamically determined, and/or may be configurable.

Figure 13:
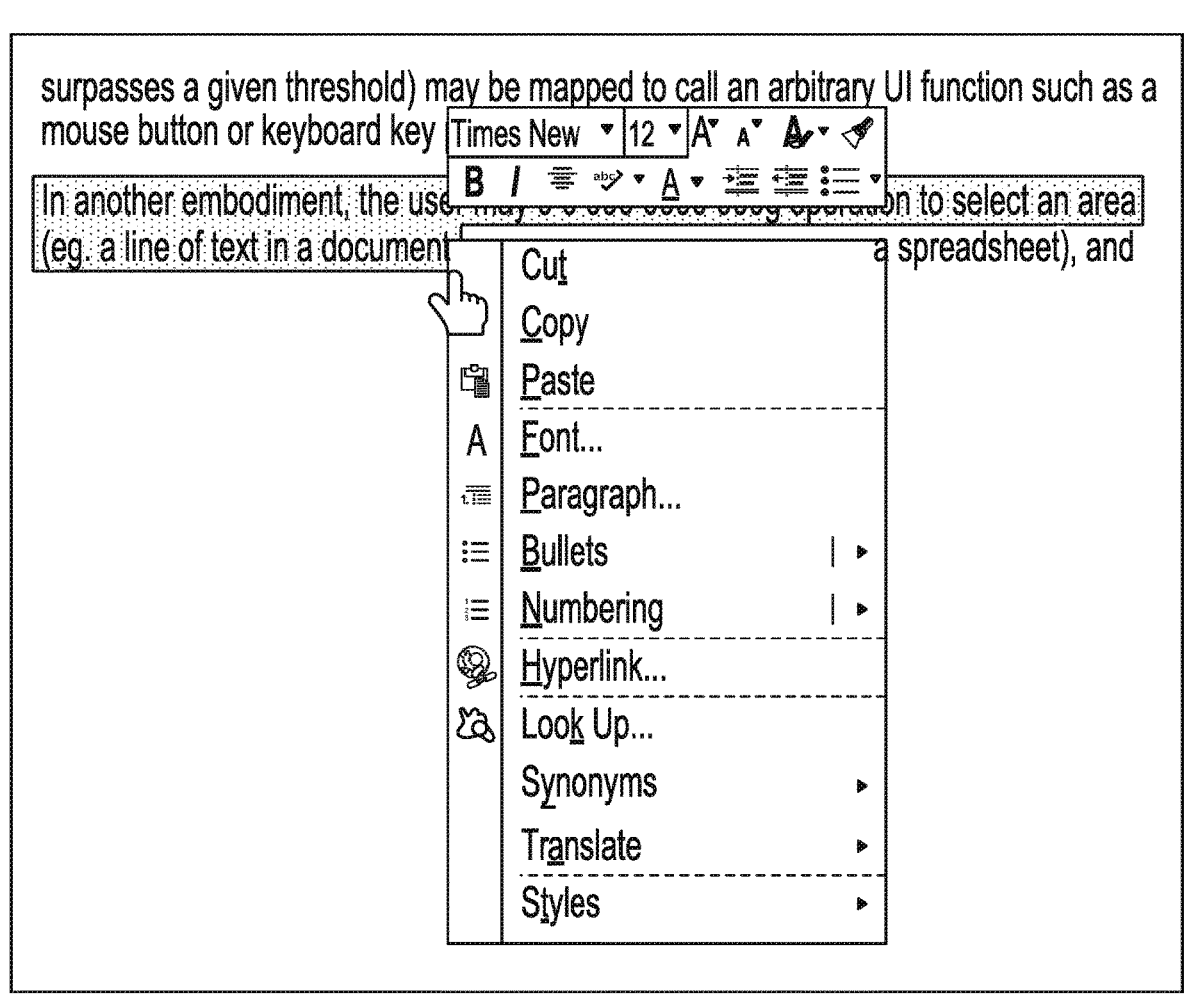
FIG. 13 is a diagram showing an example user interface interaction using force information to provide a context menu.

FIG. 13 is a diagram showing an example user interface interaction using force information to provide a context menu. In some embodiments, traditional touch input device button (e.g., mouse button) functionality may be mapped to one or more force intensity levels. For example, a "left button click" input may be performed by a touch input with a force within a first intensity range and a "right button click" input may be performed by a touch input with a force within a second intensity range. In some embodiments, a "middle button click" input may be performed by a touch input with a force within a third intensity range. In some embodiments, a user may select an area (e.g., spreadsheet cells) or text by performing a touch and drag operation with a force intensity below a predetermined threshold. Before the touch input is released, a user may indicate that a context menu is desired (e.g., "right button click") by increasing the force of the touch input above a predetermined/dynamic/configurable threshold level. Diagram 1300 shows text selected using a touch and drag operation and a context menu displayed when the force of the touch input was increased above a predetermined/dynamic/configurable threshold level.

Figure 14:
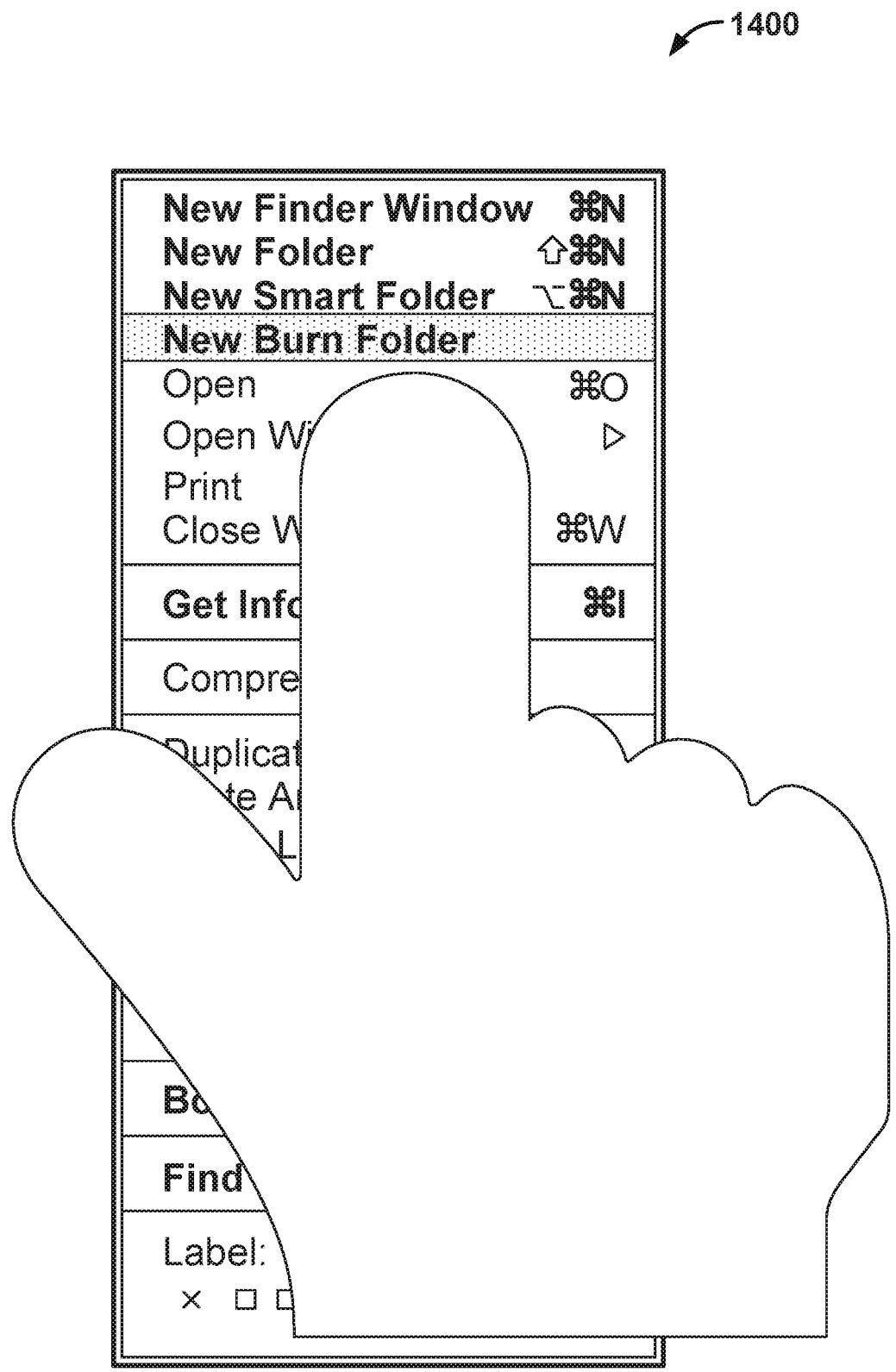
FIG. 14 and FIG. 15 are diagrams showing examples of user interface interactions using force information to navigate a menu.
Figure 15:
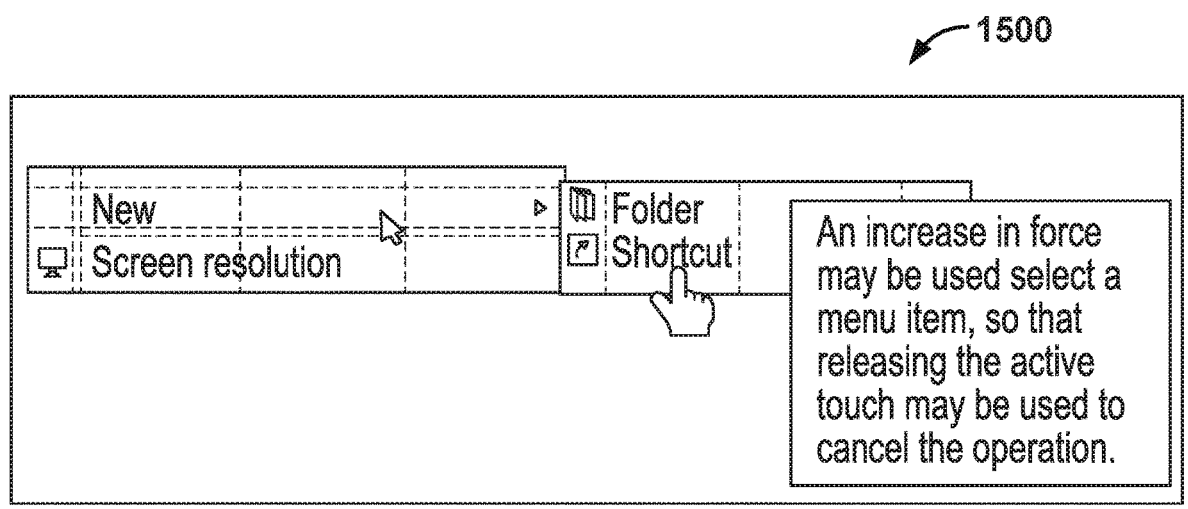

FIG. 14 and FIG. 15 are diagrams showing examples of user interface interactions using force information to navigate a menu. As shown in diagram 1400, a user may navigate a menu by touching and dragging a touch input to desired menu items. A user selects a menu item by increasing the force of the touch input above a threshold level and a user cancels the menu by releasing the touch input without ever increasing the force of the touch input above the threshold level. As shown in diagram 1500, a user can navigate a cascading menu by touching and dragging a touch input to desired cascading menu items. A user selects a cascading menu item by increasing the force of the touch input above a threshold level and a user cancels the cascading menu by releasing touch input without ever increasing the force of the touch input above the threshold level. The threshold levels may be preconfigured, dynamically determined, and/or configurable.

Figure 16:
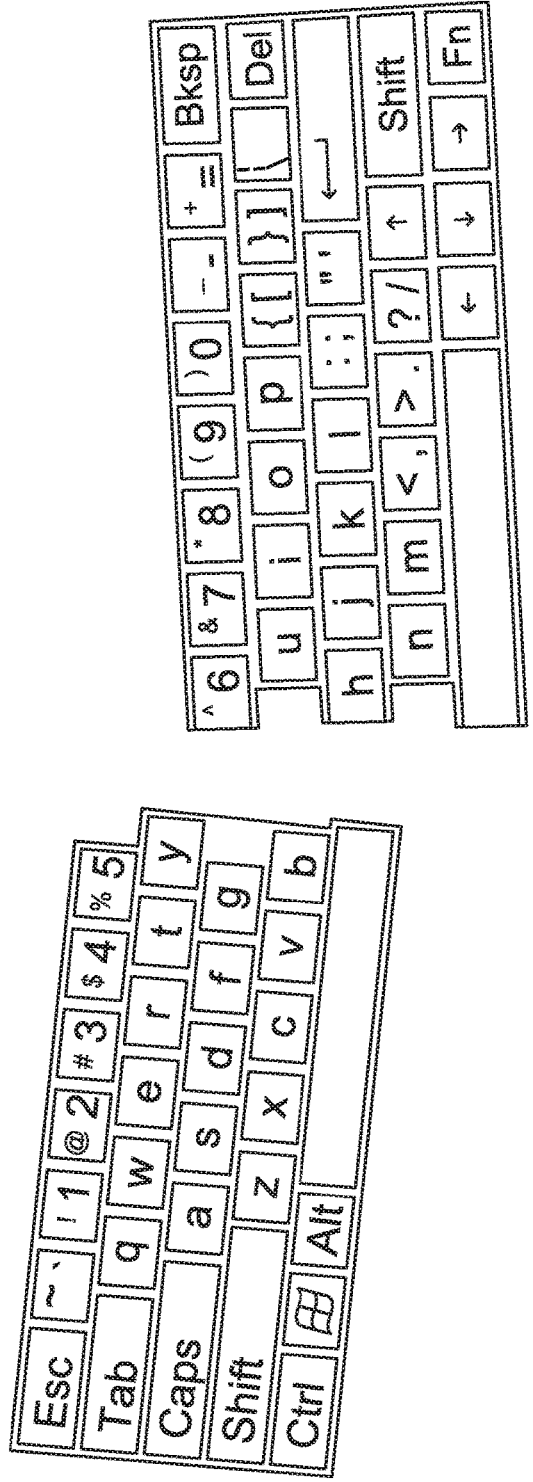
FIG. 16 is a diagram showing an example user interface interaction using force information to interact with a virtual keyboard.

FIG. 16 is a diagram showing an example user interface interaction using force information to interact with a virtual keyboard. In some embodiments, the virtual keyboard includes a keyboard that is displayed on a screen or projected on a surface. In some embodiments, a touch input key of a virtual keyboard is only registered as a key press if the force of the touch input is above a threshold level or within a first intensity range. For example, "lightly" resting fingers on a virtual keyboard will not register key presses on the virtual keyboard and a touch input will only be registered a key press when a greater force intensity is provided on the key of the virtual keyboard. This may reduce spurious key press events (e.g., often generated simply due to a finger lightly brushing or contacting the surface). In some embodiments, alternate key functionality may be indicated based on a force of touch input. For example, if a force of a touch input on a key is within a first range, a lower case or normal character of the key is indicated and if the force of the touch input is within a second range (e.g., greater than the first range), then a shifted/capitalized character of the key is indicated. The threshold levels may be preconfigured, dynamically determined, and/or configurable.

In some embodiments, a touch input gesture and a force associated with the gesture indicates that a virtual keyboard should be displayed and/or not displayed. For example, when a predetermined number of distinct touch inputs are detected simultaneously (e.g., 4 or 5 fingers of each hand resting on a touch input surface), a keyboard is displayed. In some embodiments, a displayed virtual keyboard is oriented and/or located on a screen based at least in part on one or more touch inputs received. For example, a virtual keyboard is oriented and placed on a touch input display surface such that when fingers of a user are rested on the surface, the keys of the home row of the virtual keyboard are placed under the location and orientation of the placed fingers of the user to place the virtual keyboard in standard touch typing position with respect to the user's fingers. The keyboard may be split to match the orientation of fingers of the user's two hands. Diagram 1600 shows a virtual keyboard that has been displayed for a user that has placed fingers of the user's left hand higher and angled out as compared to fingers of the user's right hand that has been placed lower in the opposite angle. In some embodiments, a touch input to a key of the virtual keyboard of diagram 1600 is only registered as a keyboard key press if the force of the touch input is above a threshold. The threshold levels may be preconfigured, dynamically determined, and/or configurable.

Figure 17:
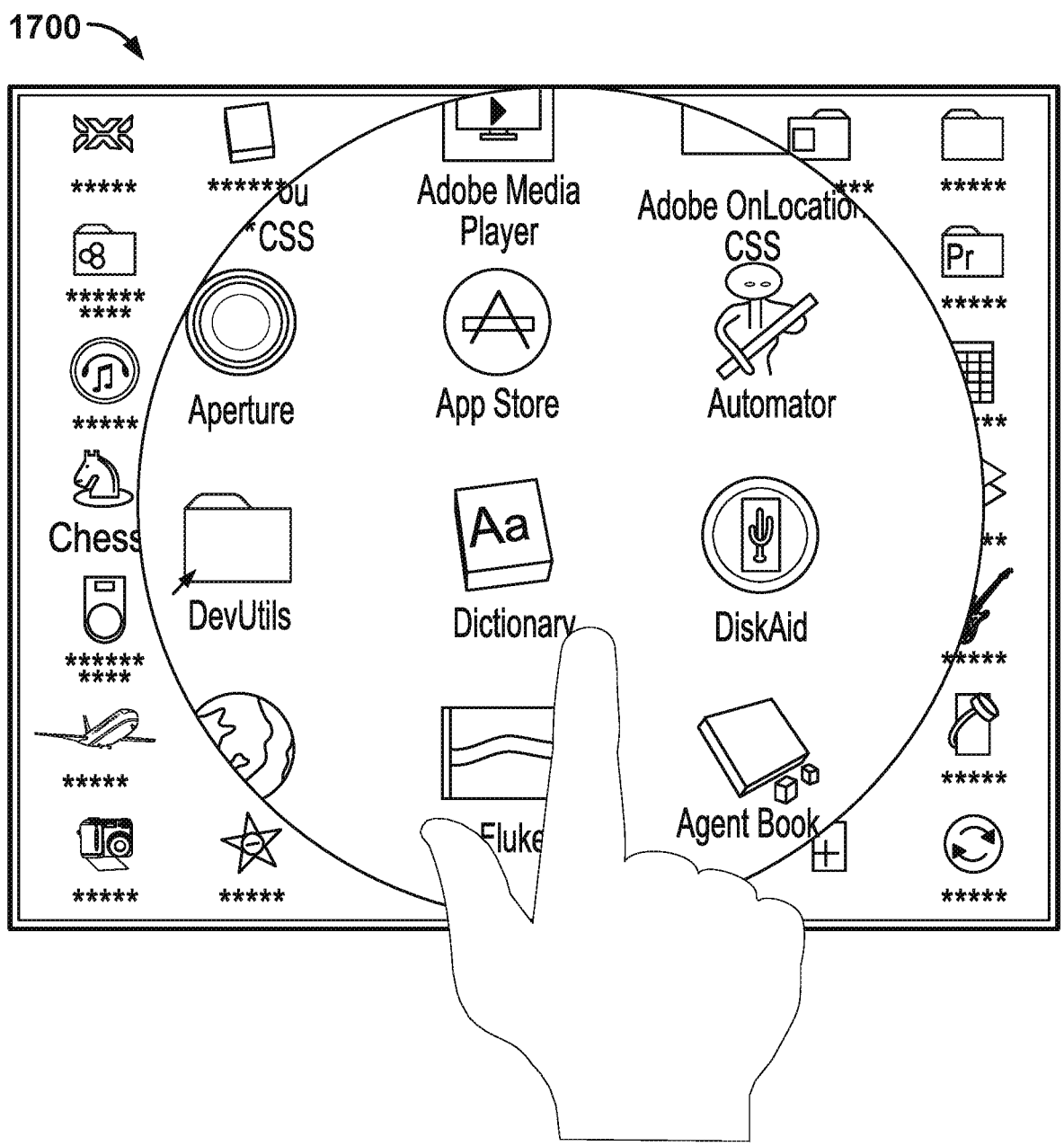
FIG. 17 and FIG. 18 are diagrams showing example user interface interactions using force information to zoom and select user interface objects.
Figure 18:
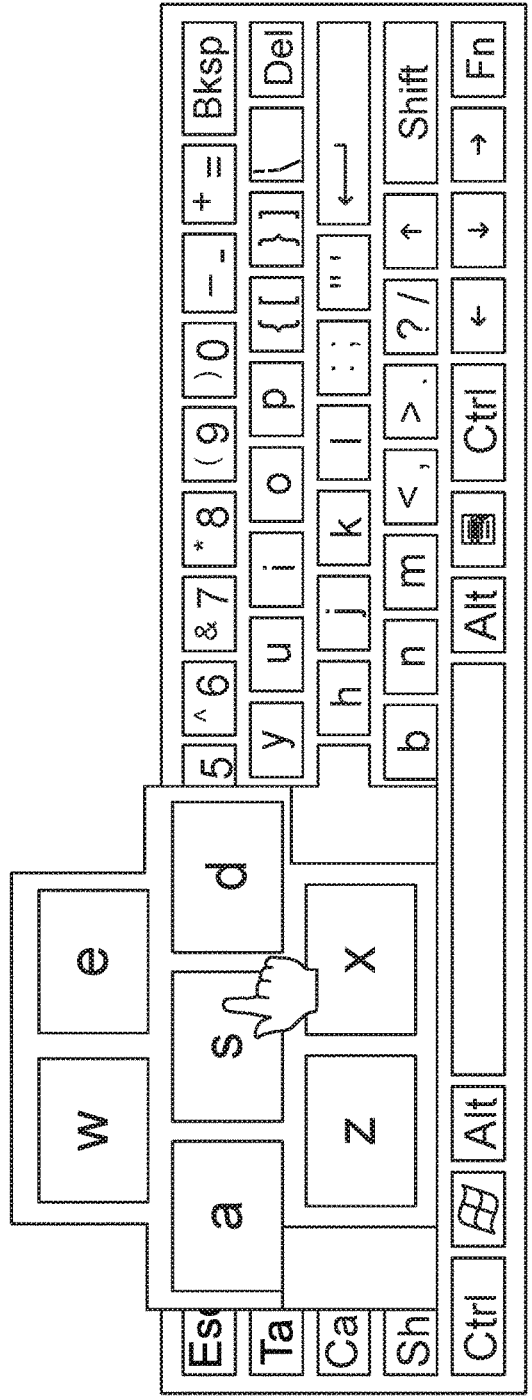

FIG. 17 and FIG. 18 are diagrams showing example user interface interactions using force information to zoom and select user interface objects. In some embodiments, force information is used to aid in navigating a dense array of objects on the screen (such as icons, keys, or several hyperlinks close by one another in a body of text). As shown in diagram 1700 and 1800, by "lightly" touching a touch input display surface, a region around the touch contact point is shown magnified on a display, indicating in greater detail what object on the screen is underneath the contact point that is being used to provide touch input. When the object to be selected (e.g., icon in diagram 1700 and keyboard key in diagram 1800) is underneath the contact point, increasing the force of the touch input to a level greater than a predetermined threshold level (e.g., configurable) selects the object. In some embodiments, when a user selects an object and/or completes a user interface action, a physical feedback (e.g., haptic feedback), visual feedback, and/or audio feedback may be provided. In some embodiments, when a force of a touch input reaches a threshold level, a physical feedback (e.g., haptic feedback), visual feedback, and/or audio feedback may be provided.

In some embodiments, force information of touch input is used to distinguish between different gestures that otherwise might be identical or very similar. For example, a swipe touchscreen gesture of a first force intensity within a first threshold range may be interpreted as a scrolling/panning indication and a swipe touchscreen gesture of a second force intensity within a second threshold range may be interpreted as a "change to the next window/tab" indication.

Figure 19:
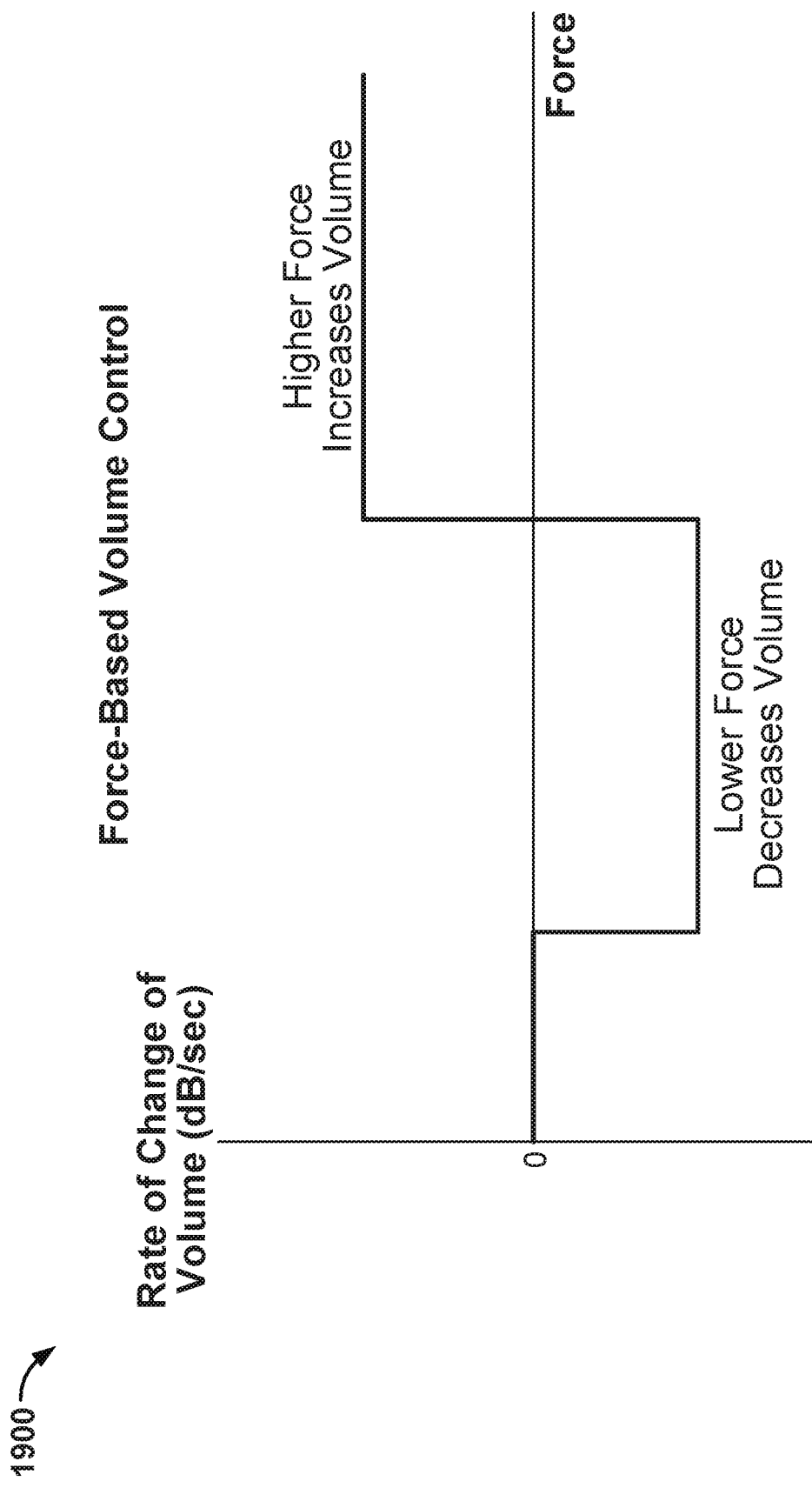
FIG. 19 is a graph illustrating an example of a relationship between detected touch input force and direction of change in audio volume.

FIG. 19 is a graph illustrating an example of a relationship between detected touch input force and direction of change in audio volume. Graph 1900 shows that when a touch input is within a first intensity range, volume is not changed, when a touch input is within a second intensity range, volume decrease functionality is indicated, and when a touch input is within a third intensity range, volume increase functionality is indicated. In some embodiments, force information of a touch input is used to control audio volume level of a device. In some embodiments, volume is increased if a force of a touch input is above a threshold value (e.g., predetermined, dynamically determined, and/or configurable) and the volume is decreased if the force is below the threshold value. In some embodiments, the touch input must be received in a specified area (e.g., displayed volume adjustment bar or a designated area of a device for adjusting volume) to control the volume. In some embodiments, the rate of change of the volume is proportional to an amount of force applied in a touch input. In some embodiments, an audio output destination is selected based at least in part on a force of a touch input. For example, the audio is outputted to an earpiece of a device with no touch input, and as a touch input is provided with an increasing force that meets a threshold level, a speakerphone function engages at a volume proportional to a detected force.

Figure 20:
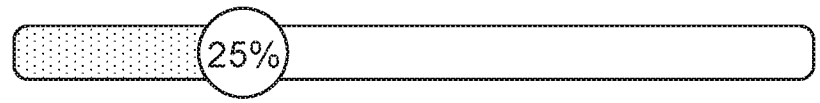
FIG. 20 is a diagram showing an example user interface interaction using force information to interact with a slider bar.
Figure 20:
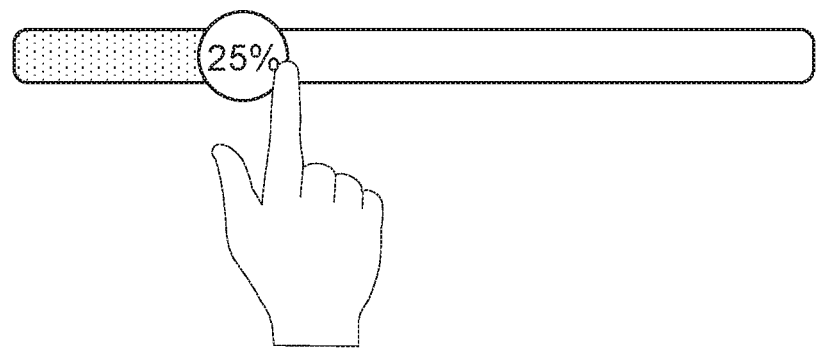
Figure 20:
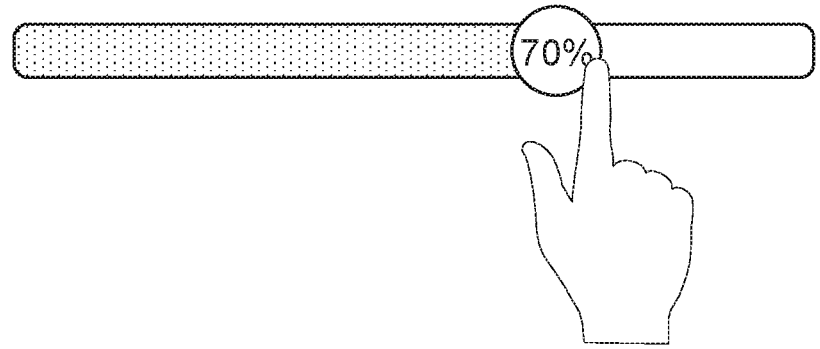

FIG. 20 is a diagram showing an example user interface interaction using force information to interact with a slider bar. In some embodiments, a slider bar may be used to indicate an intensity level or a time location (e.g., video position during playback). In some embodiments, when navigating through a video sequence, a user wants the slider to move quickly to a particular time index/portion of the sequence, but then move with greater precision to focus on a particular scene or even a single frame of video. Diagram 2000 shows a slider bar that can be moved by touching and dragging on the slider bar with a touch input.

In some embodiments, a speed or precision of slider bar movement using touch input dragging may be proportional to the force intensity level of the touch input. For example, a slider control moves with detailed/fine precision when "light" pressure is applied but moves with coarse/faster precision when "harder" pressure is applied. In some embodiments, the slider bar may be moved with greater (e.g., fine or less granular) precision when a touch input force intensity within a first intensity range is applied and moved with less (e.g., coarse or more granular) precision when a touch input force intensity within a second intensity range is applied. The threshold levels may be preconfigured, dynamically determined, and/or configurable.

In some embodiments, a velocity at which an object such as a finger or stylus contacts a touch input surface is used to control a user interface. For example, video games, virtual musical instruments (drums and pianos are two common examples), and other applications may utilize velocity information to provide desired functionality. In some embodiments, measurement of contact velocity may be achieved by measuring the rate of change of the force. For example, if the touch force changes at a given point from 0 to 0.5 pounds in 20 milliseconds, it can be inferred that the finger or other object impacted the touch input screen at high velocity. On the other hand, a change in force from 0 to 0.1 pounds in 100 milliseconds could be construed as a relatively low velocity. Both the absolute measure of pressure and the rate-of-change of pressure may be useful measures of information in user interface design.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
a transmitter configured to transmit a signal in a medium with a touch input surface prior to a touch input, wherein the transmitted signal is an acoustic signal or an ultrasonic signal; and
a processor configured to:
receive a version of the transmitted signal that has been propagated in the medium and disturbed by the touch input, wherein the transmitted signal propagated in the medium prior to the touch input has been disturbed by the touch input in a manner that affects a signal property of the transmitted signal;
determine the location of the touch input using the received version of the transmitted signal at least in part by analyzing an effect of the touch input on the transmitted signal that has been propagated in the medium and disturbed by the touch input;
receive an indicator associated with a force intensity of the touch input;
determine that the touch input is associated with an audio volume control; and
cause an adjustment of an audio volume based at least in part on the indicator associated with the force intensity of the touch input.

2. The system of claim 1, wherein the received indicator associated with the force intensity is at least in part determined by the processor using a detected signal amplitude of the received version of the transmitted signal.

3. The system of claim 1, wherein the force intensity of the touch input was at least in part determined by the processor by comparing a reference signal property of the acoustic signal or the ultrasonic signal propagating in the medium of the touch input surface prior to the touch input to a detected signal property in the received version of the transmitted signal.

4. The system of claim 1, wherein causing the adjustment of the audio volume includes increasing the audio volume in response to a determination that the force intensity is above a threshold value.

5. The system of claim 4, wherein the threshold value is dynamically determined.

6. The system of claim 1, wherein causing the adjustment of the audio volume includes decreasing the audio volume in response to a determination that the force intensity is below a threshold value.

7. The system of claim 1, wherein causing the adjustment of the audio volume includes increasing the audio volume in response to a determination that the force intensity is within a threshold range.

8. The system of claim 7, wherein an upper bound of the threshold range is associated with a maximum force intensity value.

9. The system of claim 1, wherein causing the adjustment of the audio volume includes decreasing the audio volume in response to a determination that the force intensity is within a threshold range.

10. The system of claim 9, wherein a lower bound of the threshold range is associated with a zero force intensity value.

11. The system of claim 9, wherein a lower bound of the threshold range is associated with a non-zero force intensity value.

12. The system of claim 1, wherein causing the adjustment of the audio volume includes determining whether the force intensity is within a first threshold range to decrease the audio volume or within a second threshold range to increase the audio volume.

13. The system of claim 12, wherein causing the adjustment of the audio volume includes determining whether the force intensity is below a lower bound of the first threshold range to not adjust the audio volume.

14. The system of claim 1, wherein causing the adjustment of the audio volume includes determining a rate of change of the audio volume based at least in part on the force intensity.

15. The system of claim 1, wherein causing the adjustment of the audio volume includes selecting an audio output destination.

16. The system of claim 1, wherein causing the adjustment of the audio volume includes engaging a speakerphone in response to a determination that the force intensity meets a threshold.

17. The system of claim 1, wherein the location of the touch input is at a portion of the surface assigned to control the audio volume.

18. The system of claim 1, wherein the medium with the touch input surface is a metal.

19. A method, comprising:
- causing a transmission of a signal in a medium with a touch input surface prior to a touch input, wherein the transmitted signal is an acoustic signal or an ultrasonic signal;
- receiving a version of the transmitted signal that has been propagated in the medium and disturbed by the touch input, wherein the transmitted signal propagated in the medium prior to the touch input has been disturbed by the touch input in a manner that affects a signal property of the transmitted signal;
- determining the location of the touch input using the received version of the transmitted signal at least in part by analyzing an effect of the touch input on the transmitted signal that has been propagated in the medium and disturbed by the touch input;
- receiving an indicator associated with a force intensity of the touch input;
- determining that the touch input is associated with an audio volume control; and
- causing an adjustment of an audio volume based at least in part on the indicator associated with the force intensity of the touch input.

20. A computer program product, the computer program product being embodied in a non-transitory computer readable storage medium and comprising computer instructions for:
- causing a transmission of a signal in a medium with a touch input surface prior to a touch input, wherein the transmitted signal is an acoustic signal or an ultrasonic signal;
- receiving a version of the transmitted signal that has been propagated in the medium and disturbed by the touch input, wherein the transmitted signal propagated in the medium prior to the touch input has been disturbed by the touch input in a manner that affects a signal property of the transmitted signal;
- determining the location of the touch input using the received version of the transmitted signal at least in part by analyzing an effect of the touch input on the transmitted signal that has been propagated in the medium and disturbed by the touch input;
- receiving an indicator associated with a force intensity of the touch input;
- determining that the touch input is associated with an audio volume control; and
- causing an adjustment of an audio volume based at least in part on the indicator associated with the force intensity of the touch input.

\* \* \* \* \*

UNITED STATES PATENT AND TRADEMARK OFFICE
CERTIFICATE OF CORRECTION

Page 1 of 1

PATENT NO. : 11,016,607 B2
APPLICATION NO. : 16/914150
DATED : May 25, 2021
INVENTOR(S) : Lapoe E. Lynn et al.

It is certified that error appears in the above-identified patent and that said Letters Patent is hereby corrected as shown below:

On the Title Page

Item (73), assignee, address, insert --Cayman Islands--.

In the Specification

In Column 1, Line(s) 64, before "called APR", delete "called".

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*